(12) United States Patent
Kasuga

(10) Patent No.: US 7,978,513 B2
(45) Date of Patent: Jul. 12, 2011

(54) SEMICONDUCTOR STORAGE APPARATUS, CONTROL APPARATUS AND CONTROL METHOD

(75) Inventor: Kazunori Kasuga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/815,536

(22) Filed: Jun. 15, 2010

(65) Prior Publication Data
US 2010/0265768 A1   Oct. 21, 2010

Related U.S. Application Data

(63) Continuation of application No. PCT/JP2008/050394, filed on Jan. 16, 2008.

(51) Int. Cl.
*G11C 11/34* (2006.01)
(52) U.S. Cl. .......... 365/185.03; 365/185.24; 365/185.17
(58) Field of Classification Search ............. 365/185.03, 365/185.24, 185.17
See application file for complete search history.

(56) References Cited

U.S. PATENT DOCUMENTS

| | | | |
|---|---|---|---|
| 6,353,553 B1 | 3/2002 | Tamada et al. | |
| 6,456,528 B1 | 9/2002 | Chen | |
| 6,717,847 B2 | 4/2004 | Chen | |
| 6,856,548 B2 * | 2/2005 | Tanzawa et al. | 365/185.22 |
| 7,012,835 B2 | 3/2006 | Gonzalez et al. | |
| 7,173,852 B2 | 2/2007 | Gorobets et al. | |
| 7,177,184 B2 | 2/2007 | Chen | |
| 7,224,607 B2 | 5/2007 | Gonzalez et al. | |
| 7,385,854 B2 | 6/2008 | Chen | |
| 7,518,919 B2 | 4/2009 | Gonzalez et al. | |
| 7,554,842 B2 | 6/2009 | Barzilai et al. | |
| 2006/0171210 A1 | 8/2006 | Nagashima et al. | |
| 2009/0187785 A1 | 7/2009 | Gonzalez et al. | |

FOREIGN PATENT DOCUMENTS

| | | |
|---|---|---|
| JP | 11-110142 A | 4/1999 |
| JP | 2001-210082 A | 8/2001 |
| JP | 2001-357683 A | 12/2001 |
| JP | 2005-503640 A | 2/2005 |
| JP | 2005-108303 A | 4/2005 |
| JP | 2007-507804 A | 3/2007 |

OTHER PUBLICATIONS

International Search Report of PCT/JP2008/050394, Mailing Date of Apr. 22, 2008.
International Preliminary Report on Patentability (Form PCT/IB/373) of International Application No. PCT/JP2008/050394 date of issuance Aug. 10, 2010 with forms PCT/ISA/237.

* cited by examiner

*Primary Examiner* — Son T Dinh
*Assistant Examiner* — Nam T Nguyen
(74) *Attorney, Agent, or Firm* — Westerman, Hattori, Daniels & Adrian, LLP

(57) ABSTRACT

A semiconductor storage apparatus comprising: a plurality of cells that store data; a threshold determination section that determines, based on management information that is used to manage data, a binary or multiple-valued form by which values are written to a plurality of the individual cells and determines a threshold based on the determined form of values that are to be written to a plurality of the individual cells; and a write section that writes the data to a plurality of the cells on the basis of the threshold determined by the threshold determination section.

18 Claims, 26 Drawing Sheets

| ATTRIBUTE INFORMATION | WRITE MODE |
|---|---|
| Read Only | SLC |
| Volume Label | SLC |
| Directly | SLC |
| Hidden | SLC |
| System | SLC |
| Archive | MLC |

SEMICONDUCTOR STORAGE APPARATUS, CONTROL APPARATUS AND CONTROL METHOD

CROSS-REFERENCE TO RELATED APPLICATIONS

This application is a continuation application, filed under 35 U.S.C. §111(a), of PCT Application No. PCT/JP2008/050394, filed Jan. 16, 2008, the disclosure of which is herein incorporated in its entirety by reference.

FIELD

The embodiments discussed herein are related to a semiconductor storage apparatus, a semiconductor control apparatus and a semiconductor control method that store data in cells in binary or multiple-valued form.

BACKGROUND

In recent years, the use of memory devices having nonvolatile memories, such as USB memories, flash memory cards and flash disks, has become widespread. The following multiple-value technique is known to increase the capacity of such a memory device by enabling three- or more-valued data to be stored in one memory cell: the number of voltage thresholds of each memory cell is increased as illustrated in FIG. 28, and, in the case of a four-valued memory cell, each of 2-bit data items, "11," "10," "01" and "00," is linked to a corresponding voltage level.

As a related conventional technique, a nonvolatile semiconductor storage device and a data storage system are known for having a large capacity and ensuring high levels of reliability and high-speed operations (see Patent Document 1, for example).

[Patent Document 1] Japanese Laid-open Patent Publication No. 2001-210082

SUMMARY

A semiconductor storage apparatus includes: a plurality of cells that store data; a threshold determination section that determines, based on management information that is used to manage data, a binary or multiple-valued form by which values are written to a plurality of the individual cells and determines a threshold based on the determined form of values that are to be written to a plurality of the individual cells; and a write section that writes the data to a plurality of the cells on the basis of the threshold determined by the threshold determination section.

A control apparatus for controlling a semiconductor storage apparatus that includes a plurality of cells storing data includes: a threshold determination section that determines, based on management information that is used to manage data, a binary or multiple-valued form by which values are written to a plurality of the individual cells and determines a threshold based on the determined form of values that are to be written to a plurality of the individual cells; and a write section that writes the data to a plurality of the cells on the basis of the threshold determined by the threshold determination section.

A control method for controlling a semiconductor storage apparatus that includes a plurality of cells storing data causes the semiconductor storage apparatus to execute: determining, based on management information that is used to manage data, a binary or multiple-valued form by which values are written to a plurality of the individual cells and determining a threshold based on the determined form of values that are to be written to a plurality of the individual cells; and writing the data to a plurality of the cells on the basis of the determined threshold.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 14 is a flowchart illustrating the operation of a process of starting a conversion process at the time of turning the power on.

DESCRIPTION OF EMBODIMENTS

Described here are problems about the conventional technique. The problem with the conventional technique is that a multiple-value memory device whose capacity is increased by the multiple-value technique has a low level of reliability. The following describes the problems of the multiple-value technique with reference to FIGS. 29 to 31.

Figure 29:
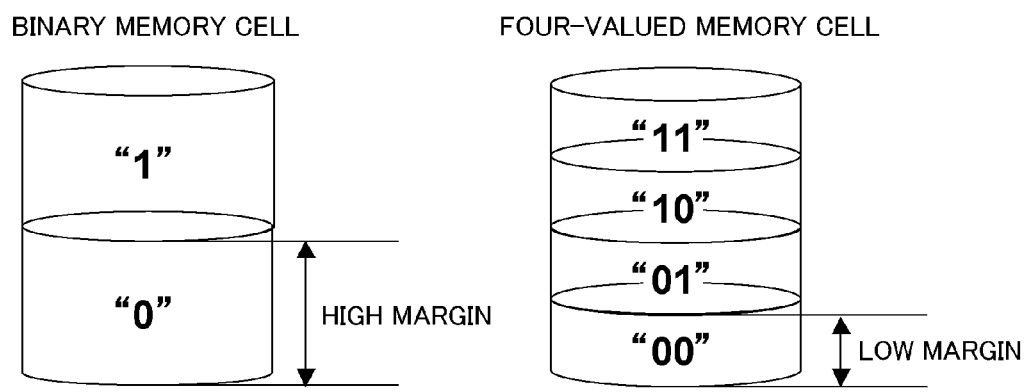
FIG. 29 is a diagram illustrating margins of a binary memory cell and a four-valued memory cell.
Figure 30:
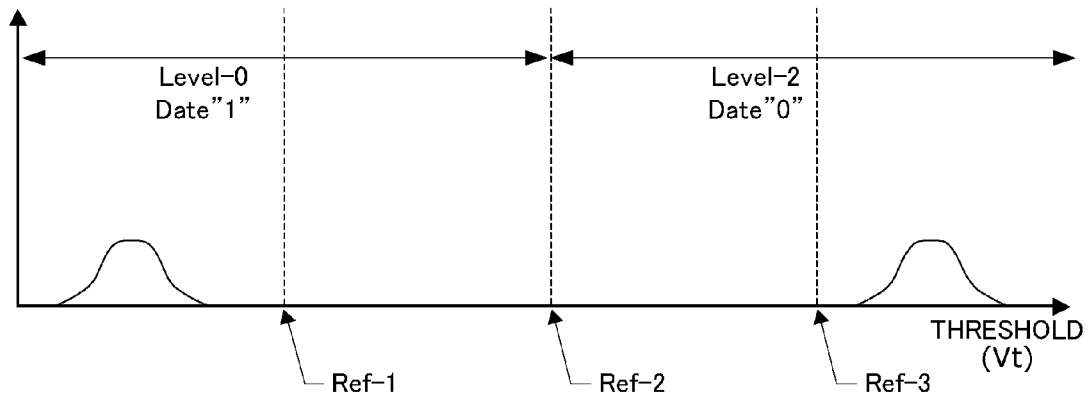
FIG. 30 is a diagram illustrating a relationship between the cell distribution of the binary memory cell and threshold.
Figure 31:
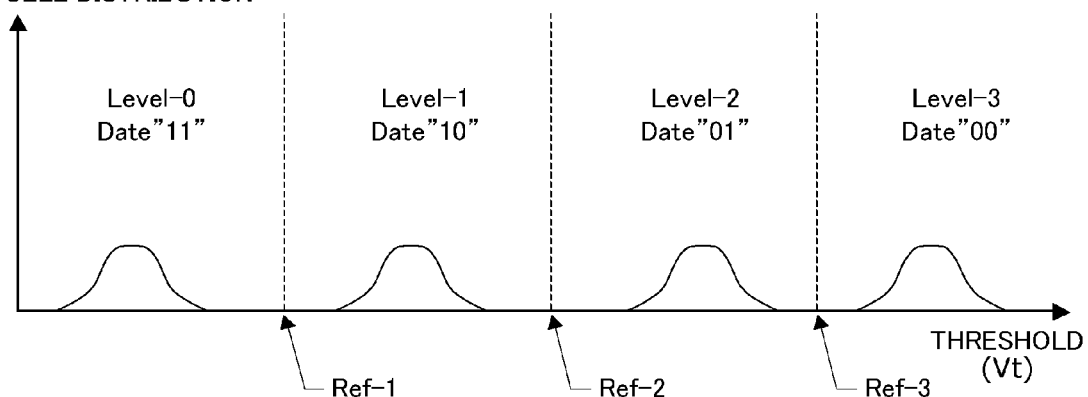
FIG. 31 is a diagram illustrating a relationship between the cell distribution of the four-valued memory cell and threshold.

FIG. 29 is a diagram illustrating margins of a binary memory cell and a four-valued memory cell. FIG. 30 is a diagram illustrating a relationship between the cell distribution of the binary memory cell and threshold. FIG. 31 is a diagram illustrating a relationship between the cell distribution of the four-valued memory cell and threshold.

As illustrated in FIG. 29, since the voltage thresholds of the binary memory cell have margins large enough to determine "0" and "1," the possibility is low that data items are inverted. Therefore, the binary memory cell achieves a high level of reliability. On the other hand, since the voltage thresholds of the four-valued memory cell do not have margins large enough to determine "00," "01," "10" and "11," the possibility is high that data items are inverted. Therefore, the four-valued memory cell has a low level of reliability.

More specifically, in the case of the binary memory cell illustrated in FIG. 30, among thresholds Ref-1, Ref-2 and Ref-3, Ref-2 serves as a threshold. Even if the voltage is at Level-0 or Level-1, it is judged that the data item is "1" as long as the voltage is lower than Ref-2. Even if the voltage is at Level-2 or Level-3, it is judged that the data item is "0" as long as the voltage is higher than Ref-2. On the other hand, in the case of the four-valued memory cell illustrated in FIG. 31, if the voltage is lower than Ref-1, it is judged that the data item is "11." If the voltage is higher than Ref-1 and lower than Ref-2, it is judged that the data item is "10." If the voltage is higher than Ref-2 and lower than Ref-3, it is judged that the data item is "01." If the voltage is higher than Ref-3, it is judged that the data item is "00." Accordingly, unlike the binary memory cell, data items are not judged to be the same even when the voltages are at Level-0 and at Level-1. If a voltage of Level-1 is applied to a memory cell to which a data item of "11" will be written, it is judged that the data item of the memory cell is "10" when the data item is read out. Incidentally, in FIG. 30, Ref-2 and Ref-3 are illustrated for the purpose of comparing the binary memory cell with the four-valued memory cell; in practice, there is only the threshold of Ref-2 in the binary memory cell.

As illustrated above, even though the multiple-value memory device has a large capacity, data stored therein has a low level of reliability. However, demand is growing for a large-capacity memory device since user data, such as images and videos, increase in size. Therefore, there is a demand for a memory device that can achieve a high level of reliability and a large capacity.

Embodiments have been made to solve the above problems and are aimed at providing a semiconductor storage device, a control device and a control method that store data in binary or multiple-valued form on the basis of management information. Hereinafter, embodiments will be described with reference to the accompanying drawings.

First Embodiment

Figure 1:
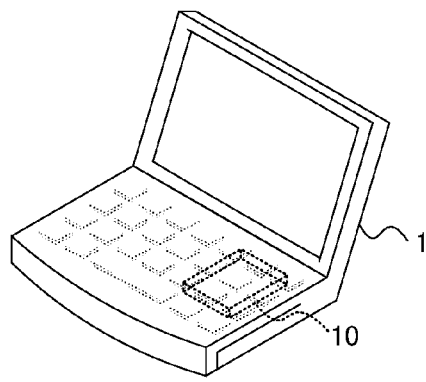
FIG. 1 is a diagram illustrating an information processing device according to a first embodiment.
Figure 2:
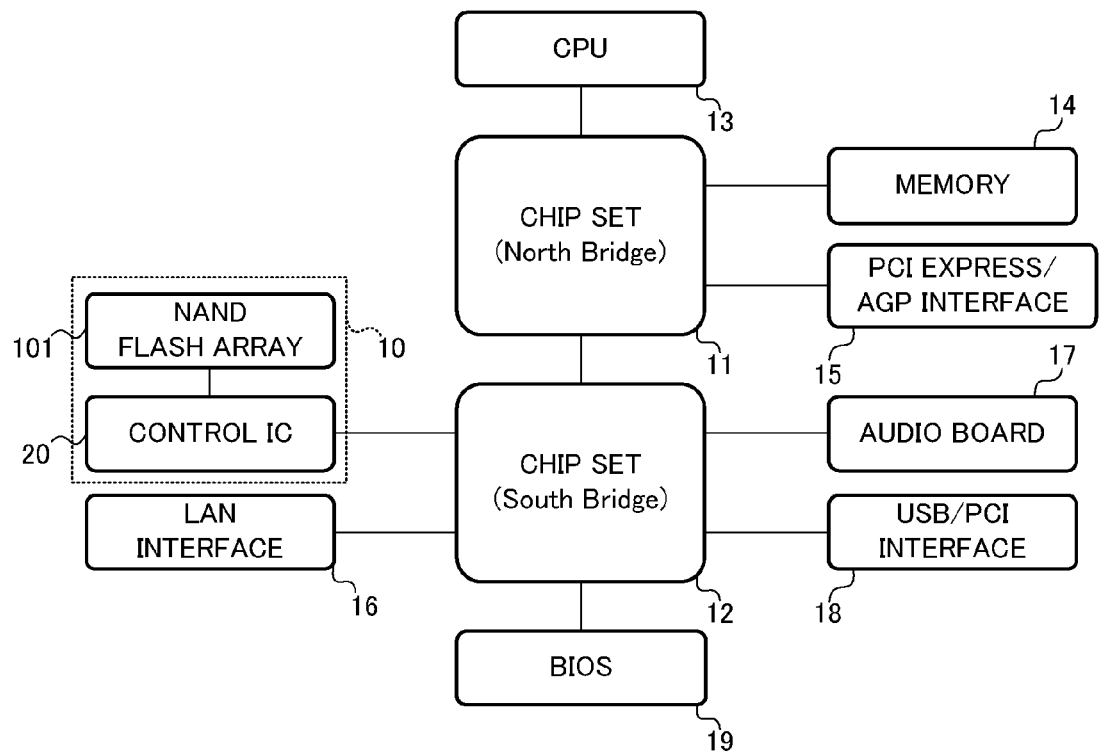
FIG. 2 is a diagram illustrating the hardware configuration of the information processing device according to the first embodiment.

An information processing device of the present embodiment will be described with reference to the drawings. FIG. 1 is a diagram illustrating an information processing device according to the present embodiment. FIG. 2 is a diagram illustrating the hardware configuration of the information processing device according to the present embodiment.

As illustrated in FIG. 1, an information processing device 1 of the present embodiment is a personal computer equipped with a NAND flash memory 10 serving as an auxiliary memory device. As illustrated in FIG. 2, the information processing device 1 includes a memory 14 that serves as a main storage device; and a CPU 13 that serves as a central processing unit. The information processing device 1 also includes a chipset (North Bridge) 11 that allows high-speed information communication and control between the CPU 13, the memory 14 and the like; and a BIOS 19 that stores programs for controlling the lowest-level input and output of peripheral devices.

In addition to the components described above, the information processing device 1 includes a chipset (South Bridge) 12 that allows information communication and control between peripheral devices at comparatively lower speeds than the CPU 13 and the memory 14; an audio board 17 that controls the output of a sound source; a USB/PCI interface 18 that connects to a USB-compliant or PCI bus-compliant device; a LAN interface 16 that connects to a network board and makes it possible to communicate with the outside; and the NAND flash memory 10. The NAND flash memory 10 includes a NAND flash array 101 that is a nonvolatile memory; and a Control IC 20 that controls the NAND flash memory. Incidentally, the information processing device 1 is not limited to personal computers. The information processing device 1 can be any device that is equipped with a storage device, such as cellular phone and PDA.

Figure 3:
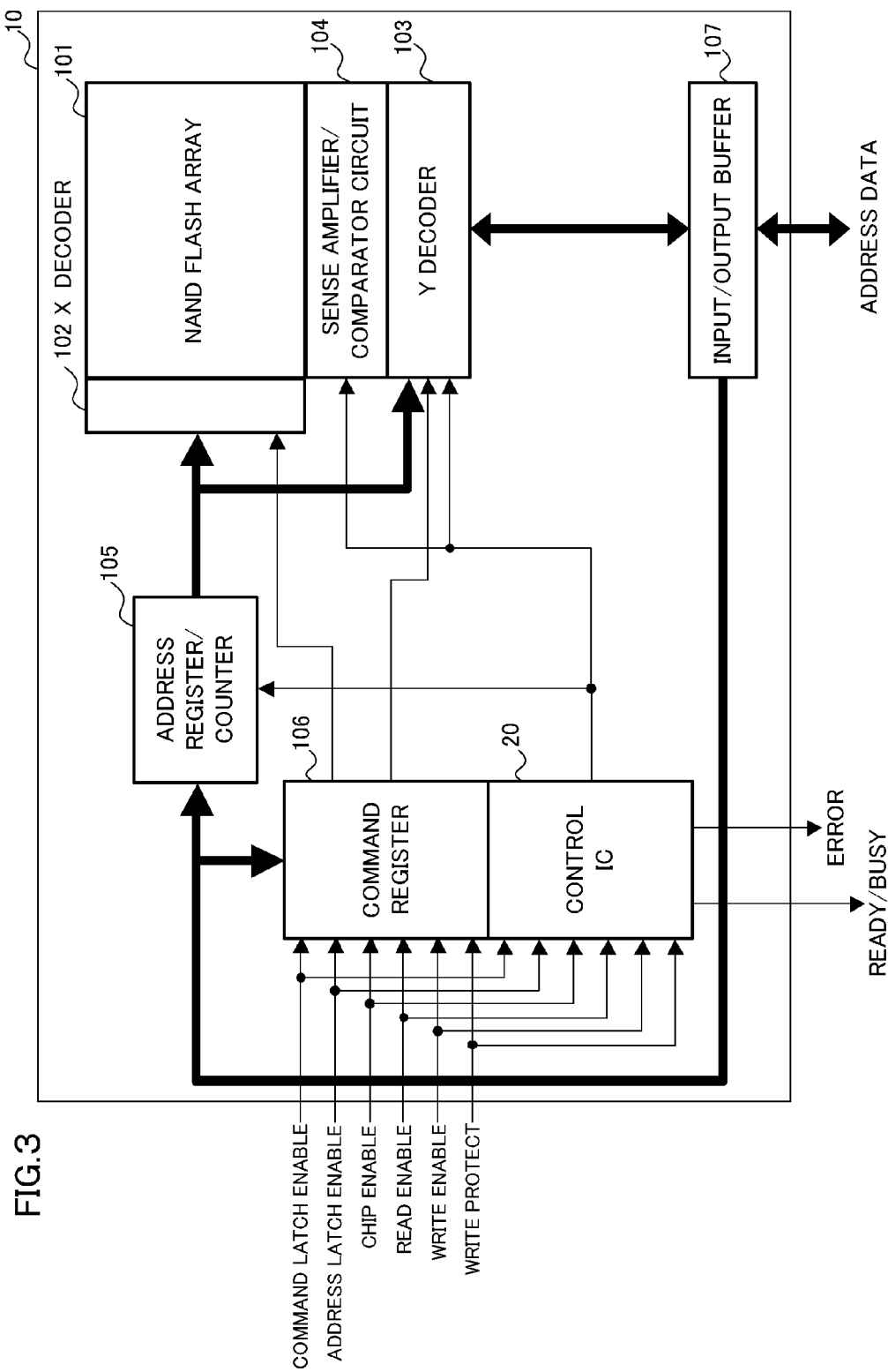
FIG. 3 is a block diagram illustrating the configuration of a NAND flash memory according to the first embodiment.

The following describes the NAND flash memory of the present embodiment. FIG. 3 is a block diagram illustrating the configuration of the NAND flash memory according to the present embodiment.

The NAND flash memory 10 includes the NAND flash array 101 (a plurality of cells; a semiconductor storage device), an X decoder 102, a Y decoder 103, a sense amplifier/comparator circuit 104, an address register/counter 105, a command register 106, an input/output buffer 107, and a control IC 20 (a control device, a threshold determination section, a detection section, a threshold conversion section, a threshold correction section, and a writing section).

The NAND flash array 101 is a nonvolatile memory having a plurality of cells. The X decoder 102 conducts the row-direction selection for a plurality of cells that are arranged in a two-dimensional manner to form the NAND flash array 101. The Y decoder 103 conducts the column-direction selection for a plurality of cells. The sense amplifier/comparator circuit 104 converts the input voltage into digital information on the basis of predetermined thresholds. The address register/counter 105 specifies an address to access the NAND flash array 101. The command register 106 retains commands received. The input/output buffer 107 is a storage area that temporarily stores data when data and addresses are input to or output from the information processing device 1 serving as a host. The control IC 20 takes control of the NAND flash memory 10.

The command register 106 and the control IC 20 receive the following signals as input/output control signals from the host: a command latch enable signal, an address latch enable signal, a chip enable signal, a read enable signal, a write enable signal, and a write protect signal. A combination of the signals serves as a command. The control IC 20 outputs a ready/busy signal and an error signal.

Figure 4:
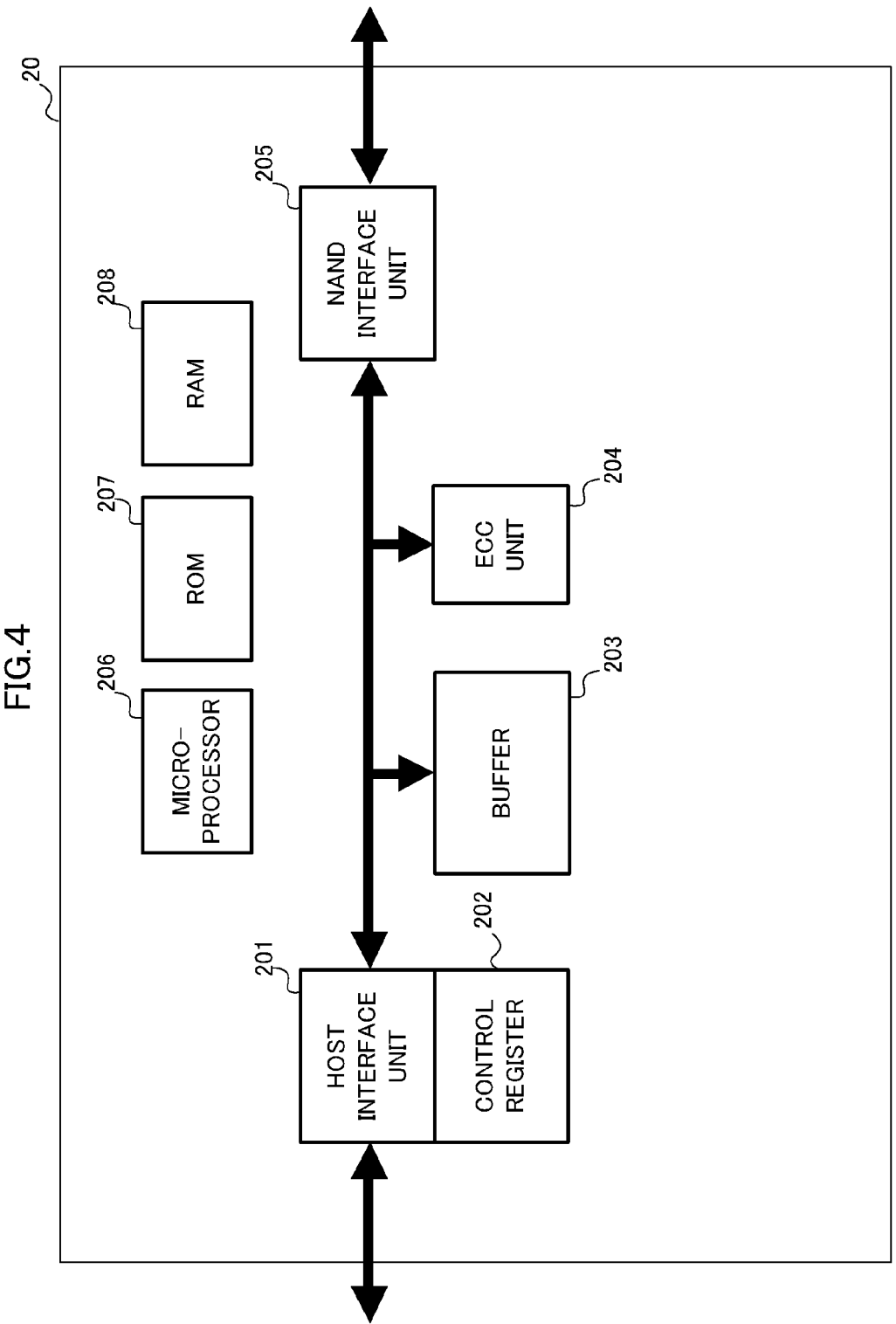
FIG. 4 is a block diagram illustrating the configuration of a control IC.

The following describes the control IC. FIG. 4 is a block diagram illustrating the configuration of the control IC.

The control IC 20 includes a host interface unit 201, a control register 202, a buffer 203, an ECC unit 204, a NAND interface unit 205, a microprocessor 206, a ROM 207, and a RAM 208.

The host interface unit 201 exchanges commands with the host. The control register 202 is an area that retains various parameters. The NAND interface unit 205 exchanges commands with the NAND flash array 101. The buffer 203 is an area that temporarily retains commands read by the NAND interface unit 205 from the NAND flash array 101 and commands received by the host interface unit from the host. The ECC unit 204 generates ECCs when data is written and detects and corrects data errors on the basis of the ECCs when the data is read.

The microprocessor 206 takes overall control of the control IC 20. The ROM 207 stores firmware that is used by the microprocessor 206 to perform processes. The RAM 208 is a memory used by the microprocessor 206.

Figure 5:
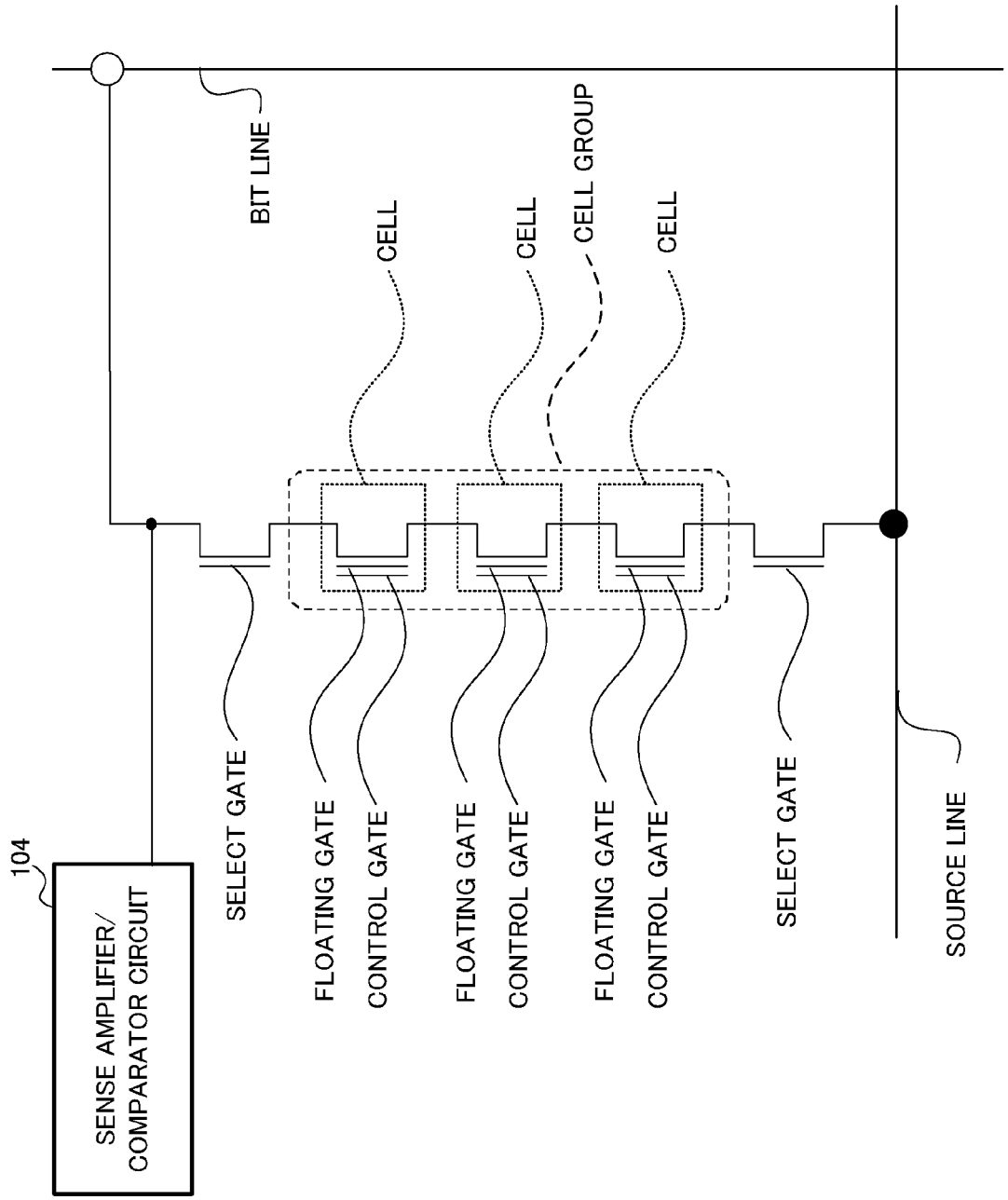
FIG. 5 is a circuit diagram illustrating a plurality of cells that are components of a NAND flash array.
Figure 6:
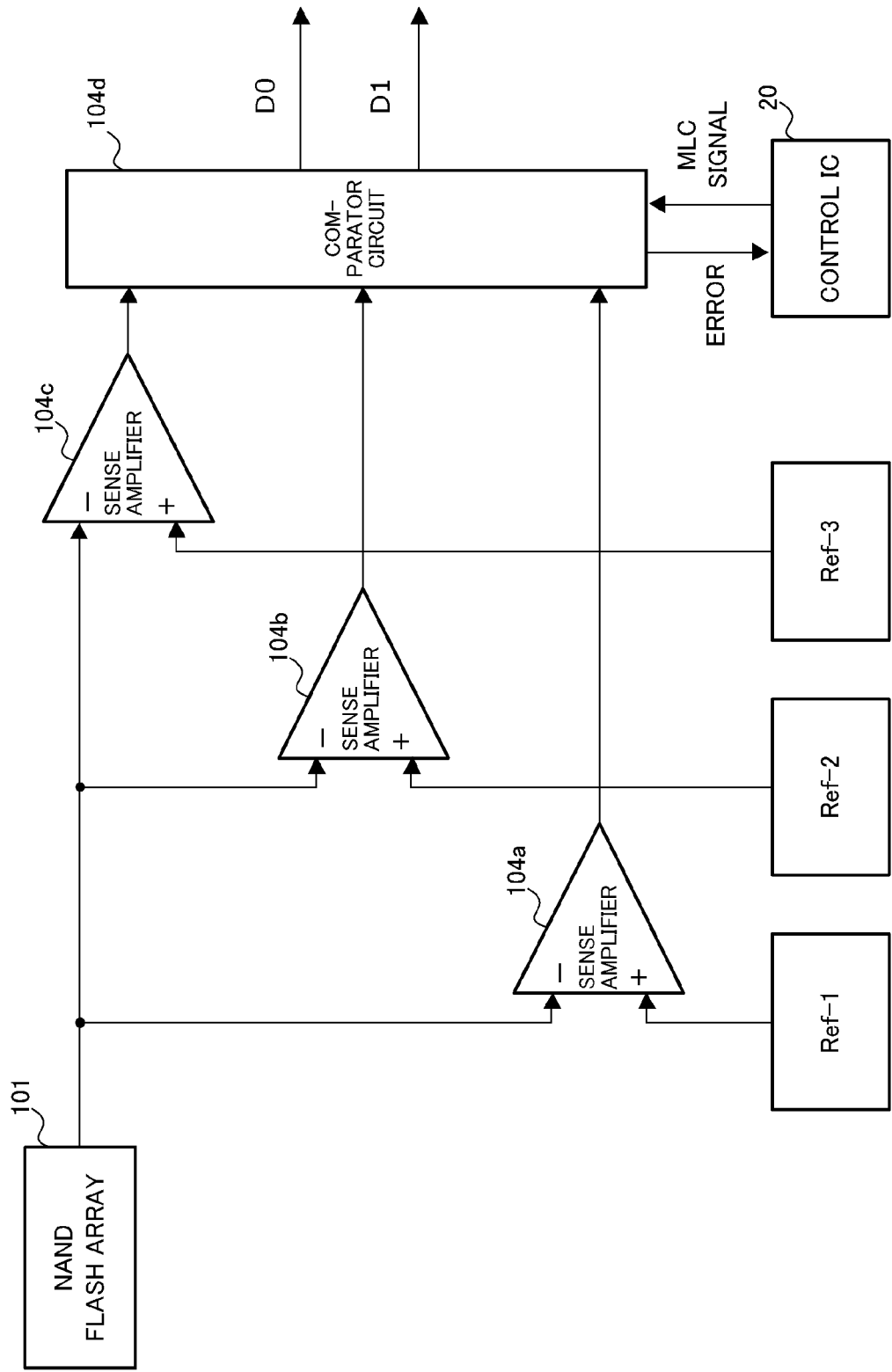
FIG. 6 is a circuit diagram illustrating a sense amplifier/comparator circuit.
Figure 7:
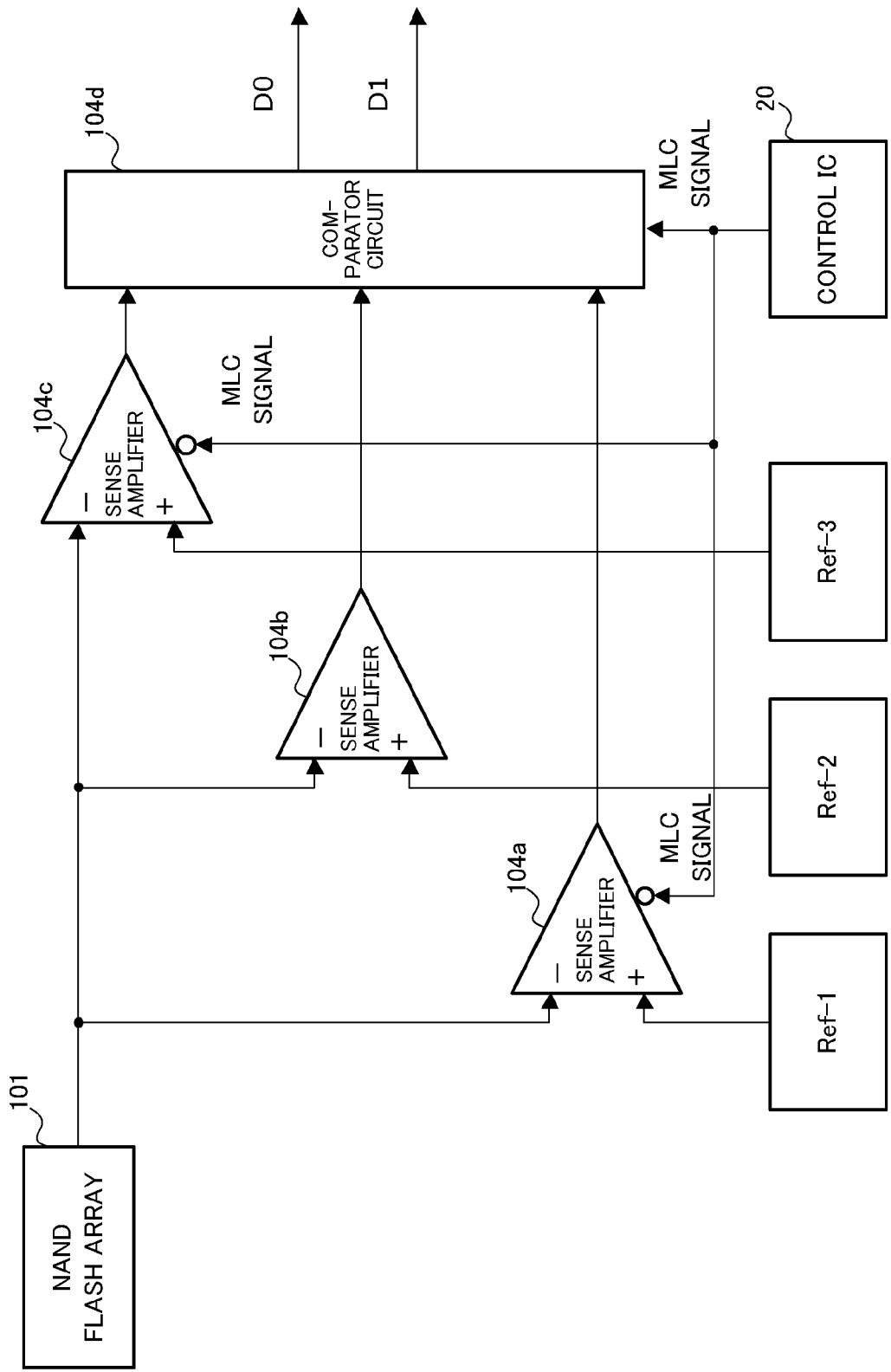
FIG. 7 is a circuit diagram illustrating a sense amplifier/comparator circuit.

The following describes a plurality of cells and the sense amplifier/comparator circuit that constitute the NAND flash array. FIG. 5 is a circuit diagram illustrating a plurality of cells that are components of the NAND flash array. FIGS. 6 and 7 are circuit diagrams illustrating the sense amplifier/comparator circuit.

As illustrated in FIG. 5, the NAND flash array 101 applies a positive voltage to the control gates of cells through a bit line and a source line. Electrons are stored in floating gates; data is therefore written. A pair of bit and source lines is connected to each group made up of a plurality of cells. Accordingly, the NAND flash array 101 writes data on a per-cell-group basis, with each cell group being made up of a plurality of cells.

As illustrated in FIG. 6, the sense amplifier/comparator circuit 104 that connects to the cells includes sense amplifiers 104a to 104c that compare an input voltage with preset thresholds (Ref-1 to Ref-3) and output the results; and a comparator circuit 104d that compares the results output from the sense amplifiers 104a to 104c and converts the results into digital data. The comparator circuit 104d switches between binary mode and four-valued mode on the basis of a MLC signal transmitted from the control IC 20. When the comparator circuit 104d does not receive the MLC signal, a value of "1" is output for the voltage below Ref-2 and a value of "0" for the voltage above Ref-2 as illustrated in FIG. 30. However, an ideal voltage is greater than Ref-3 or lower than Ref-1. If a voltage of another value is applied in binary mode, the comparator circuit outputs data using Ref-2 as the threshold. However, on the basis of the assumption that the cells deteriorate in quality, an error is returned to the control IC 20.

When the comparator circuit 104d receives the MLC signal, a value of "11" is output for the voltage below Ref-1, a value of "10" for the voltage above Ref-1 but below Ref-2, a value of "01" for the voltage above Ref-2 but below Ref-3, and a value of "00" for the voltage above Ref-3 as illustrated in FIG. 31.

As illustrated in FIG. 7, the sense amplifier/comparator circuit 104 may allow the sense amplifiers 104a and 104c to output the results of comparison only when the MLC signals are received.

Figure 8:
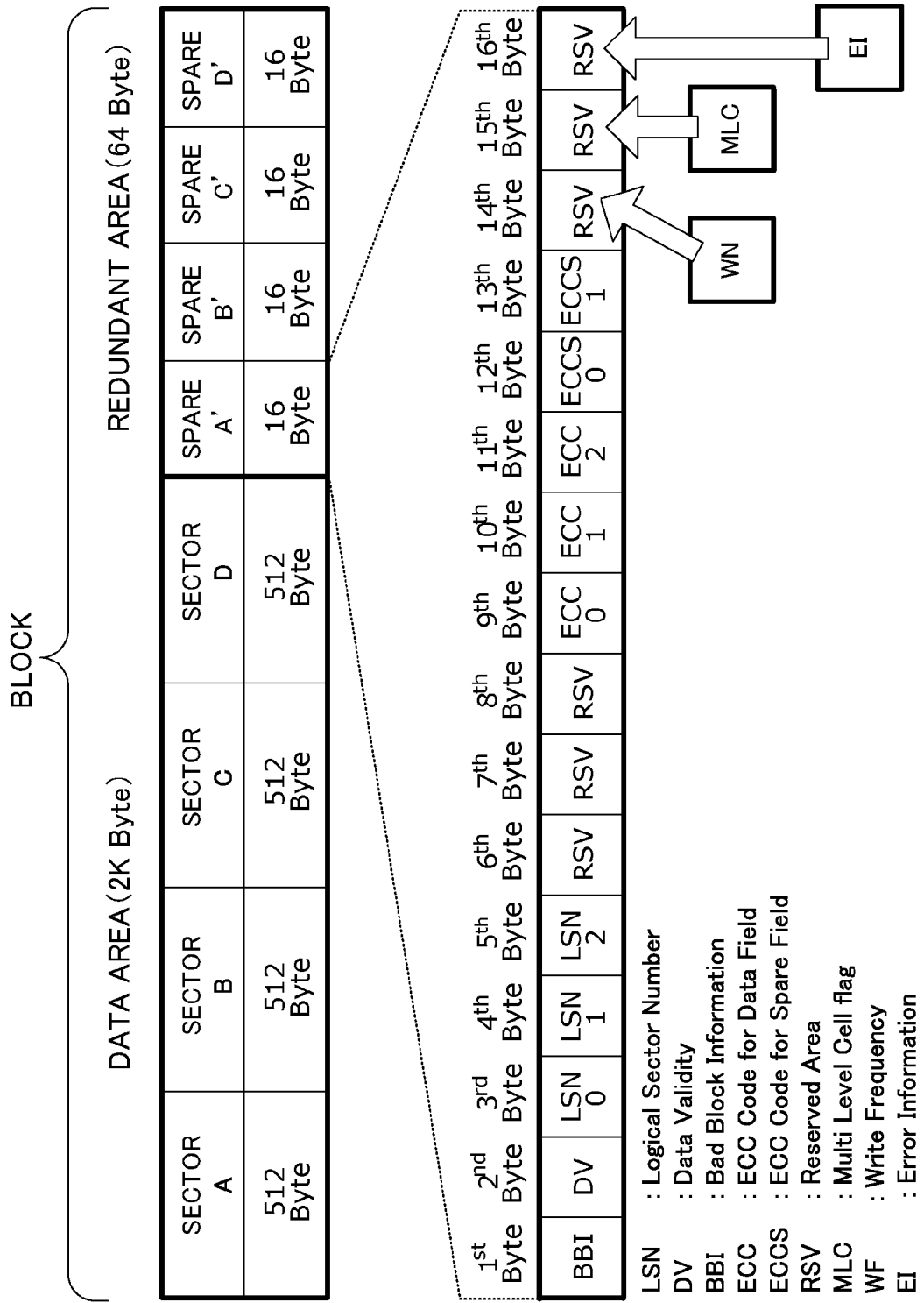
FIG. 8 is a diagram illustrating the configuration of data stored in the NAND flash array.

The following describes the configuration of data stored in the NAND flash array. FIG. 8 is a diagram illustrating the configuration of data stored in the NAND flash array.

The data that is read and written in the NAND flash memory 10 is stored in a data area on a per-sector basis as illustrated in FIG. 8. In a redundant area, spares that are redundant data corresponding to sectors are stored. Data is deleted on a per-block basis, with each block being made up of sectors A to D and spares A' to D' corresponding to the sectors. The following items are written in the spare of each sector; LSN (Logical Sector Number) that is data indicating a corresponding sector number; DV (Data validity) that is data used for validity check; BBI (Bad Block Information) that indicates a bad block to which data may not be written due to the deterioration of cells; ECC (Error Correction Code for Data Field) that is an error correction code for sector; ECCS (Error Correction Code for Spare Field) that is an error correction code for spare; MLC Flag (Multiple Level Cell Flag) that is a flag indicating data is stored in four-valued form; WF (Write Frequency) that indicates the number of times data is written to the sectors; EI that indicates the sector is a sector for which an error is returned from the sense amplifier/comparator circuit 104.

Incidentally, the MLC Flag is set at Y or N, with Y indicating that data is stored in the sector in four-valued form and N indicating that data is stored in the sector in binary form. The EI is set at 0 or 1, with 0 indicating that there is no problem with the sector in terms of threshold while 1 indicating that there is a problem with the sector in terms of threshold. The EI is set at 0 in an initial state.

Figures 9, 10:
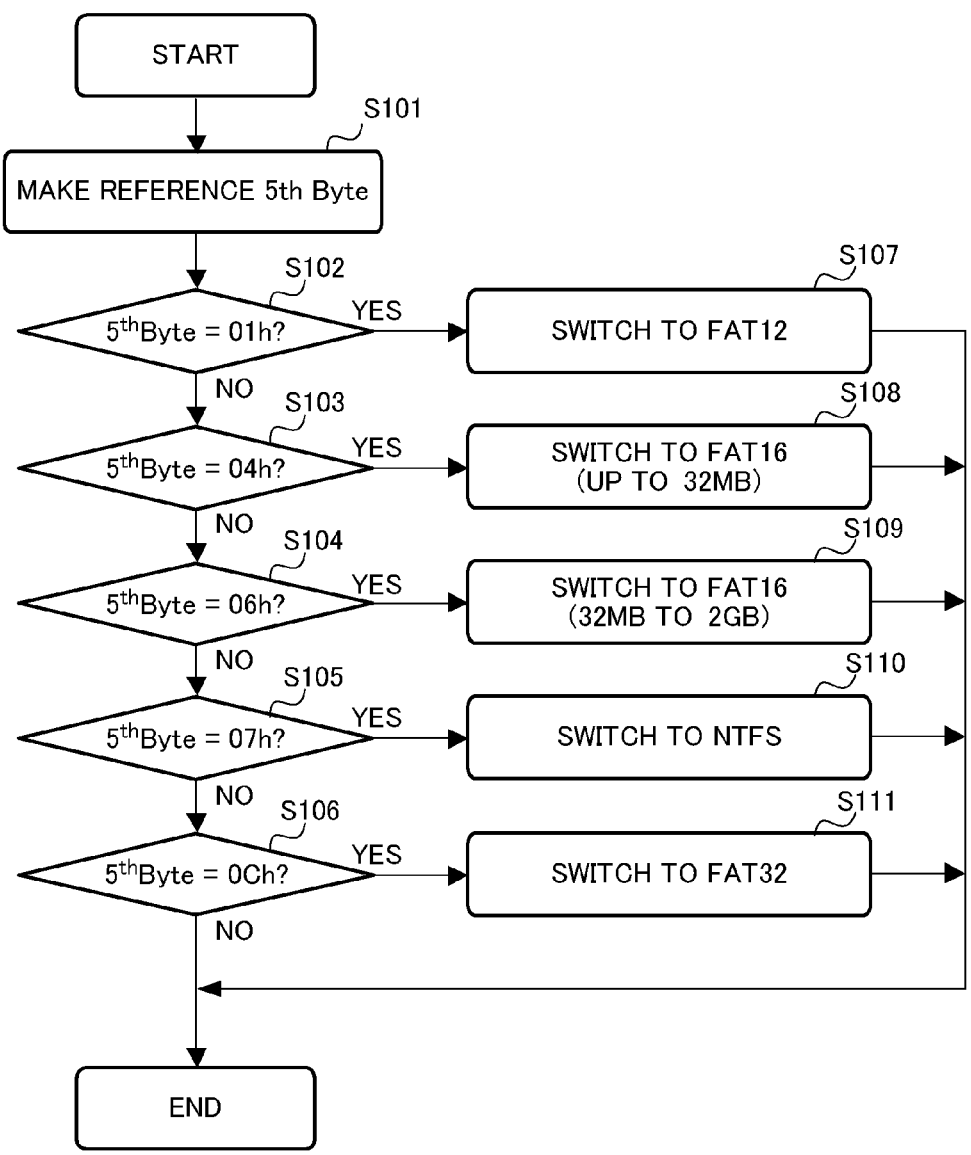
FIG. 9 is a diagram illustrating a setting table.
FIG. 10 is a flowchart illustrating the operation of a file system identification process.

The following describes a setting table stored in the NAND flash array. FIG. 9 is a diagram illustrating a setting table.

Stored in the NAND flash array 101 is the setting table illustrated in FIG. 9. Pieces of attribute information and write modes are stored in the setting table in such a manner as to be associated with one another, with the pieces of attribute information corresponding to file systems of the NAND flash array 101. The write mode is set at SLC (Single Level Cell) or MLC (Multi Level Cell), with the SLC indicating that data is stored in binary form and the MLC indicating that data is stored in four-valued form. According to the setting table, data is stored in the NAND flash array 101 in four-valued form only when the attribute information of the data is Archive.

Incidentally, the setting table is designed to support FAT 16, a file system. However, suppose that setting tables are also prepared for various file systems. The setting tables may be stored in the ROM 207 of the control IC 20.

The following describes the operation of the NAND flash memory of the present embodiment. First, the microprocessor 206 of the control IC 20 identifies the file system of the NAND flash array in order to identify the attribute information of data. FIG. 10 is a flowchart illustrating the operation of a file system identification process.

The microprocessor 206 makes the NAND interface unit 205 read from the NAND flash array 101 $5^{th}$ Byte of a partition table, which is information indicating the type of the file system (S101). The microprocessor 206 makes a determination as to whether the $5^{th}$ Byte is 01h (S102).

When the 5$^{th}$ Byte is not 01h (S102, NO), the microprocessor 206 makes a determination as to whether the 5$^{th}$ Byte is 04h (S103).

When the 5$^{th}$ Byte is not 04h (S103, NO), the microprocessor 206 makes a determination as to whether the 5$^{th}$ Byte is 06h (S104).

When the 5$^{th}$ Byte is not 06h (S104, NO), the microprocessor 206 makes a determination as to whether the 5$^{th}$ Byte is 07h (S105).

When the 5$^{th}$ Byte is not 07h (S105, NO), the microprocessor 206 makes a determination as to whether the 5$^{th}$ Byte is 0Ch (S106).

When the 5$^{th}$ Byte is not 0Ch (S106, NO), the microprocessor 206 ends the process.

When the 5$^{th}$ Byte is 0Ch (S106, YES), the microprocessor 206 reads the setting table supporting FAT32 out from the NAND flash array 101 as a setting table used to determine the attribute information of files and stores the setting table in the RAM (S111).

When it is determined at step S105 that the 5$^{th}$ Byte is 07h (S105, YES), the microprocessor 206 reads the setting table supporting NTFS out from the NAND flash array 101 as a setting table used to determine the attribute information of files and stores the setting table in the RAM (S110).

When it is determined at step S104 that the 5$^{th}$ Byte is 06h (S104, YES), the microprocessor 206 reads the setting table supporting FAT16 (32 MB to 2 GB) out from the NAND flash array 101 as a setting table used to determine the attribute information of files and stores the setting table in the RAM (S109).

When it is determined at step S103 that the 5$^{th}$ Byte is 04h (S103, YES), the microprocessor 206 reads the setting table supporting FAT16 (up to 32 MB) out from the NAND flash array 101 as a setting table used to determine the attribute information of files and stores the setting table in the RAM (S108).

When it is determined at step S102 that the 5$^{th}$ Byte is 01h (S102, YES), the microprocessor 206 reads the setting table supporting FAT12 out from the NAND flash array 101 as a setting table used to determine the attribute information of files and stores the setting table in the RAM (S107).

According to the above operation, the microprocessor 206 identifies the file system of the NAND flash array 101 and sets the setting table corresponding to the file system in the RAM. The above file system is one example. Depending on an OS stored in the NAND flash memory 10 or the environment, corresponding file systems may be set in advance by the control IC 20. According to the present embodiment, the file system of the NAND flash array 101 is FAT16 (32 MB to 2 GB).

Figure 11:
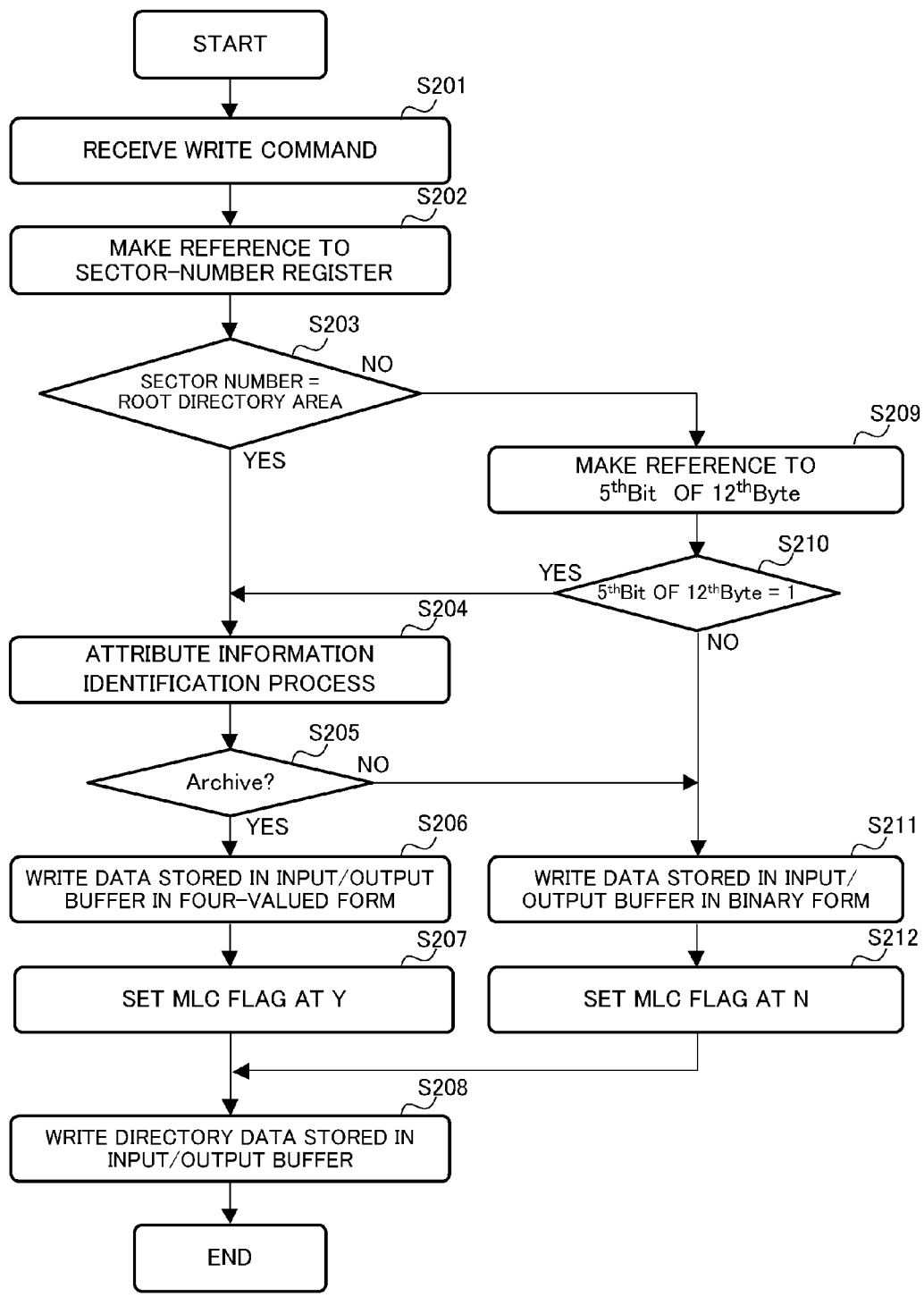
FIG. 11 is a flowchart illustrating the operation of a write process according to the first embodiment.

After a write command to write data is transmitted from the host to the NAND flash memory 10 in which an appropriate file system is set in advance thanks to the above operation, the microprocessor 206 performs a write process described below. FIG. 11 is a flowchart illustrating the operation of the write process.

After receiving a write command from the host via the host interface unit 201 (S201), the microprocessor 206 makes reference to the LSN, which is the sector number (S202) and makes a determination as to whether the LSN is the number indicating a root directory area (S203).

When the LSN is the number indicating a root directory area (S203, YES), the microprocessor 206 performs an attribute information identification process described below (S204; a threshold determination step) and makes a determination as to whether the attribute information in the setting table is about an attribute of four-valued setting, or Archive (S205; the threshold determination step).

When the attribute information is Archive (S205, YES), the microprocessor 206 allows the data stored in the input/output buffer 107 to be stored in the NAND flash array 101 in four-valued form through the NAND interface unit 205 (S206; a write step); sets the MLC flag of the spare that is redundant data of the sector of the data written to the NAND flash array 101 at Y (S207); and allows the directory data stored in the input/output buffer 107 to be stored in the NAND flash array 101 (S208).

When it is determined at step S205 that the attribute information is not Archive (S205, NO), the microprocessor 206 allows the data stored in the input/output buffer to be stored in the NAND flash array 101 in binary form through the NAND interface unit 205 (S211; the write step); sets the MLC flag of the data written to the NAND flash array 101 at N (S212); and allows the directory data stored in the input/output buffer 107 to be stored in the NAND flash array 101 (S208).

When it is determined at step S203 that the LSN is not the number indicating the root directory area (S203, NO), the microprocessor 206 makes reference to 5$^{th}$ bit of 12$^{th}$ Byte of the data stored in the input/output buffer (S209) and makes a determination as to whether the 5$^{th}$ bit of the 12$^{th}$ Byte is 1 (S210).

When the 5$^{th}$ bit of the 12$^{th}$ Byte is 1 (S210, YES), the microprocessor 206 performs the attribute information identification process described below (S204).

When the 5$^{th}$ bit of the 12$^{th}$ Byte is not 1 (S210, NO), the microprocessor 206 allows the data stored in the input/output buffer to be stored in the NAND flash array 101 in binary form through the NAND interface unit 205 (S211); sets the MLC flag of the data written to the NAND flash array 101 at N (S212); and allows the directory data stored in the input/output buffer 107 to be stored in the NAND flash array 101 (S208).

Figure 12:
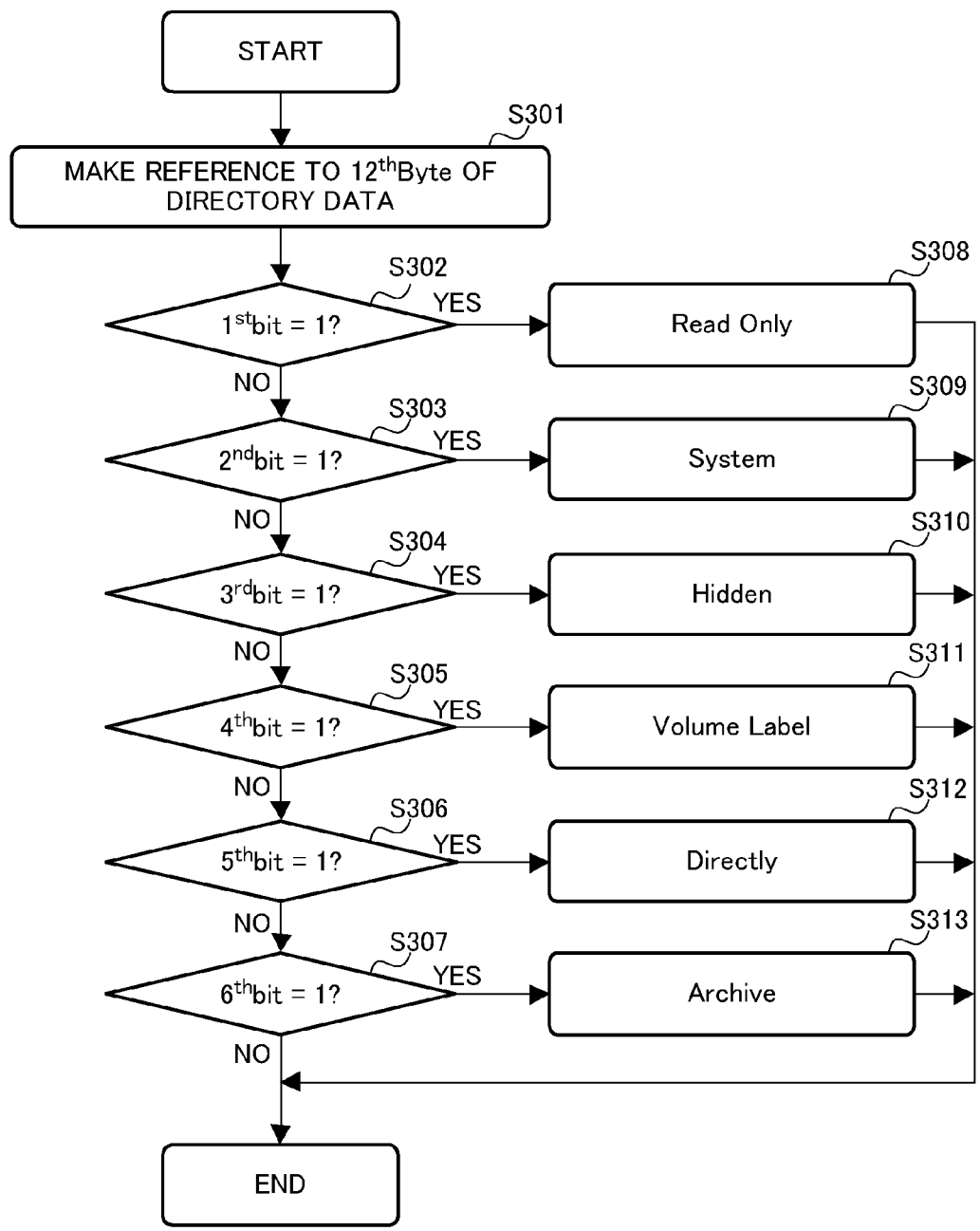
FIG. 12 is a flowchart illustrating the operation of an attribute information identification process.

The following describes the attribute information identification process that is the process of step S204 in FIG. 11. FIG. 12 is a flowchart illustrating the operation of the attribute information identification process. Incidentally, in the case of FIG. 12, suppose the control IC has already received a write command and that the data has been stored in the input/output buffer.

First, the microprocessor 206 makes reference to 12$^{th}$ Byte of the directory data stored in the input/output buffer 107 (S301) and makes a determination as to whether 1$^{st}$ Bit of the 12$^{th}$ Byte is 1 (S302).

When the 1$^{st}$ Bit is not 1 (S302, NO), the microprocessor 206 makes a determination as to whether 2$^{nd}$ Bit of the 12$^{th}$ Byte is 1 (S303).

When the 2$^{nd}$ Bit is not 1 (S303, NO), the microprocessor 206 makes a determination as to whether 3$^{rd}$ Bit of the 12$^{th}$ Byte is 1 (S304).

When the 3$^{rd}$ Bit is not 1 (S304, NO), the microprocessor 206 makes a determination as to whether 4$^{th}$ Bit of the 12$^{th}$ Byte is 1 (S305).

When the 4$^{th}$ Bit is not 1 (S305, NO), the microprocessor 206 makes a determination as to whether 5$^{th}$ Bit of the 12$^{th}$ Byte is 1 (S306).

When the 5$^{th}$ Bit is not 1 (S306, NO), the microprocessor 206 makes a determination as to whether 6$^{th}$ Bit of the 12$^{th}$ Byte is 1 (S307).

When the 6$^{th}$ Bit is not 1 (S307, NO), the microprocessor 206 ends the attribute information identification process.

When the 6$^{th}$ Bit is 1 (S307, YES), the microprocessor 206 regards the attribute information as Archive (S313).

When it is determined at step S306 that the 5$^{th}$ Bit is 1 (S306, YES), the microprocessor 206 regards the attribute information as Directly (S312).

When it is determined at step S305 that the 4$^{th}$ Bit is 1 (S305, YES), the microprocessor 206 regards the attribute information as Volume Label (S311).

When it is determined at step S304 that the 3$^{rd}$ Bit is 1 (S304, YES), the microprocessor 206 regards the attribute information as Hidden (S310).

When it is determined at step S303 that the 2$^{nd}$ Bit is 1 (S303, YES), the microprocessor 206 regards the attribute information as System (S309).

When it is determined at step S302 that the 1$^{st}$ Bit is 1 (S302, YES), the microprocessor 206 regards the attribute information as Read Only (S308).

As described above, data is stored in binary or four-valued form depending on the preset attribute information. Therefore, for example, system data and other kinds of data that may require high levels of reliability can be stored in binary form; user data and other kinds of data that may not require high levels of reliability can be stored in four-valued form. Therefore, it is possible to achieve a high level of reliability and a large capacity at the same time. The storage method may switch between binary mode, four-valued mode and eight-valued mode step by step depending on how important the data is.

Figure 13:
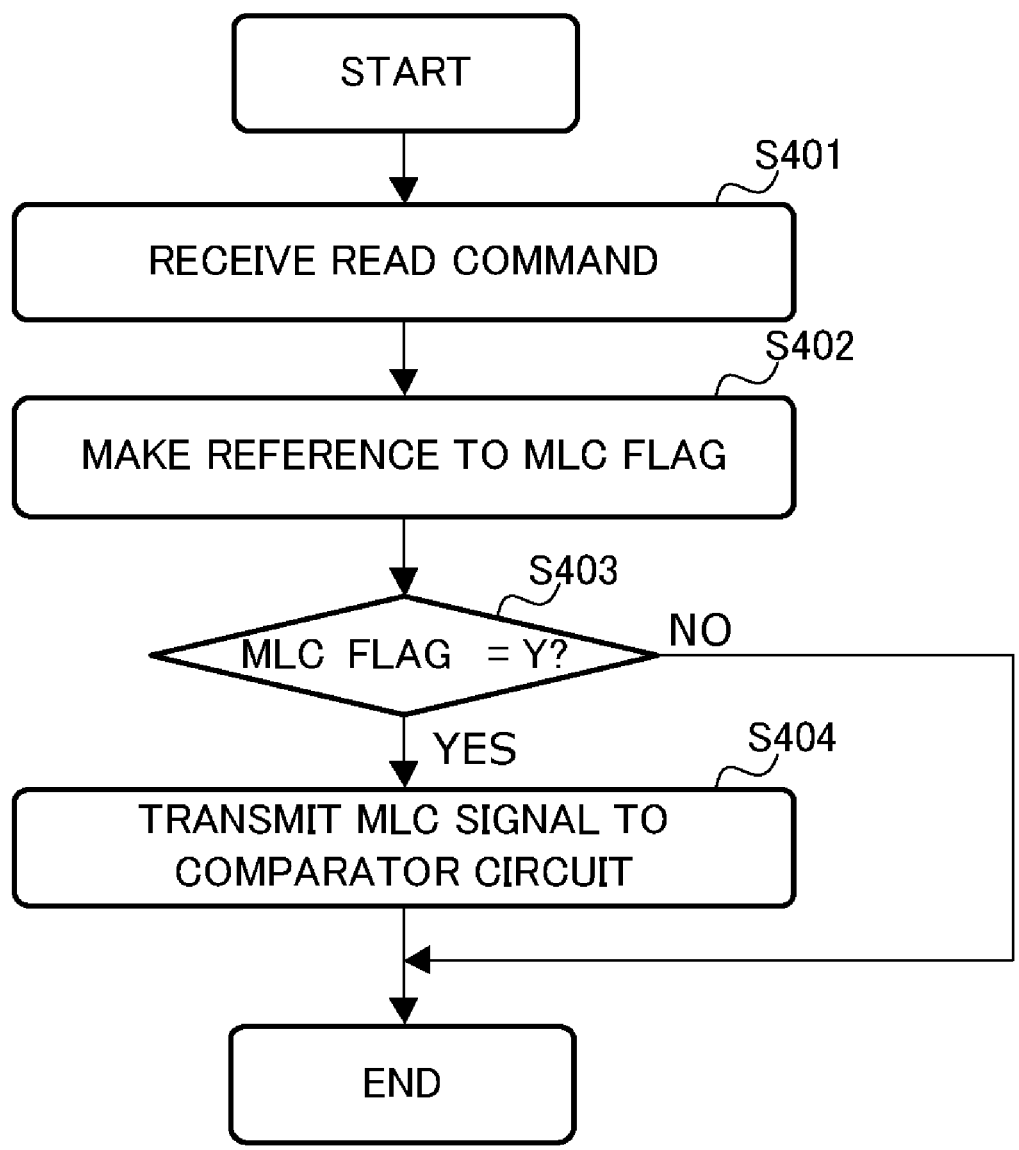
FIG. 13 is a flowchart illustrating the operation of a switching process.

The following describes a process of switching between binary and four-valued modes when data stored in the NAND flash array in binary or four-valued form is read out. FIG. 13 is a flowchart illustrating the operation of the switching process.

After the host interface unit 201 receives a read command from the host (S401), the microprocessor 206 makes reference to the MLC flag of the data stored in the NAND flash array specified by the read command through the NAND interface unit 205 (S402) and makes a determination as to whether the value of the MLC flag is Y (S403).

When the value of the MLC flag is Y (S403, YES), the microprocessor 206 transmits a MLC signal to the sense amplifier/comparator circuit 104 through the NAND interface unit 205 (S404).

When the value of the MLC flag is not Y (S403, NO), the microprocessor 206 ends the process.

As described above, the microprocessor 206 makes reference to the MLC flag of the data and determines the way the data is stored. As illustrated in FIGS. 6 and 7, when the data is in four-valued form, the microprocessor 206 transmits the MLC signal to the sense amplifier/comparator circuit 104 in order to switch between binary and four-valued modes. Moreover, the data read is transmitted to the host through the input/output buffer 107.

Figure 14:
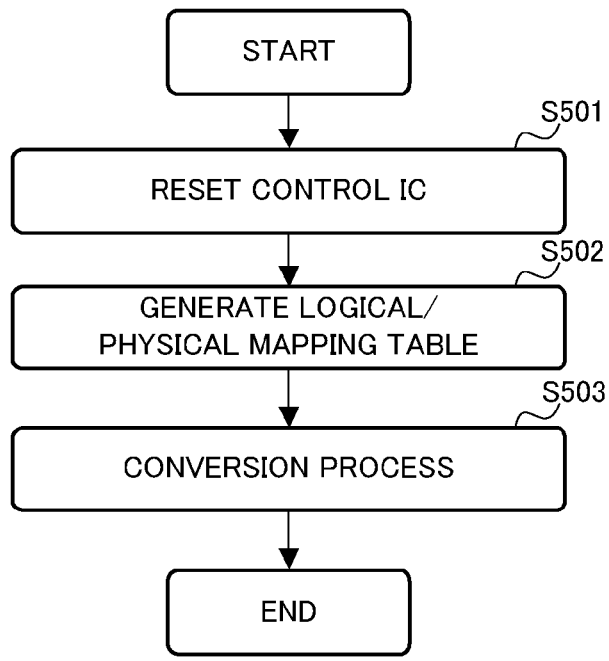

The following describes a process of converting data written in binary form to the one in four-valued form with reference to FIGS. 14 to 19. FIG. 14 is a flowchart illustrating the operation of a process of starting the conversion process at the time of turning the power on.

After the information processing device 1 is turned on, the control IC 20 is reset (S501). Then, the microprocessor 206 of the reset control IC creates a logical/physical mapping table (S502) and performs the conversion process described below (S503).

Figure 15:
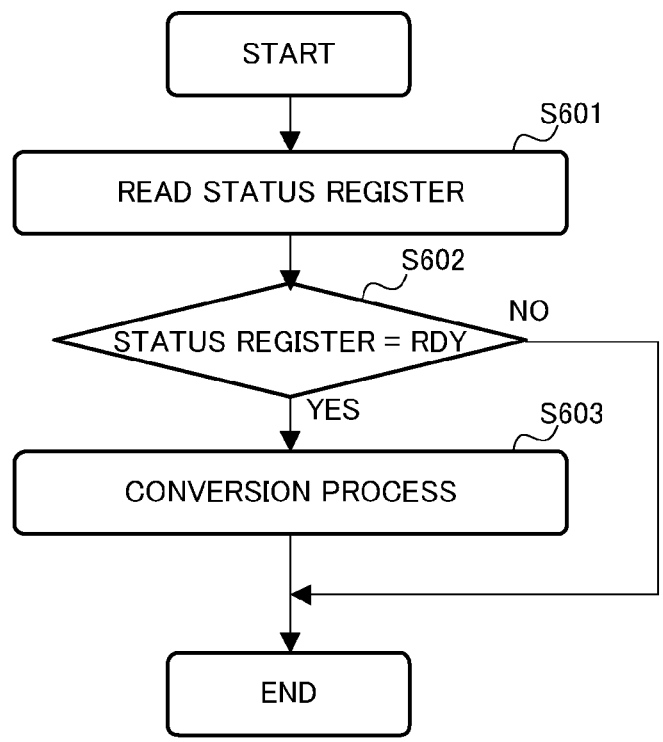
FIG. 15 is a flowchart illustrating the operation of a process of starting the conversion process at the time of sitting idle.

FIG. 15 is a flowchart illustrating the operation of a process of starting the conversion process at the time of sitting idle.

First, the microprocessor 206 reads the value of a status register (S601) and makes a determination as to whether the value of the status register is RDY which indicates an idle state (S602).

When the value of the status register is RDY (S602, YES), the microprocessor 206 performs the conversion process described below (S603).

When the value of the status register is not RDY (S602, NO), the microprocessor 206 ends the process. Incidentally, according to the present embodiment, the value of the status register may be acquired from a status register of the CPU of the information processing device 1 or from a status register of the microprocessor 206.

Figure 16:
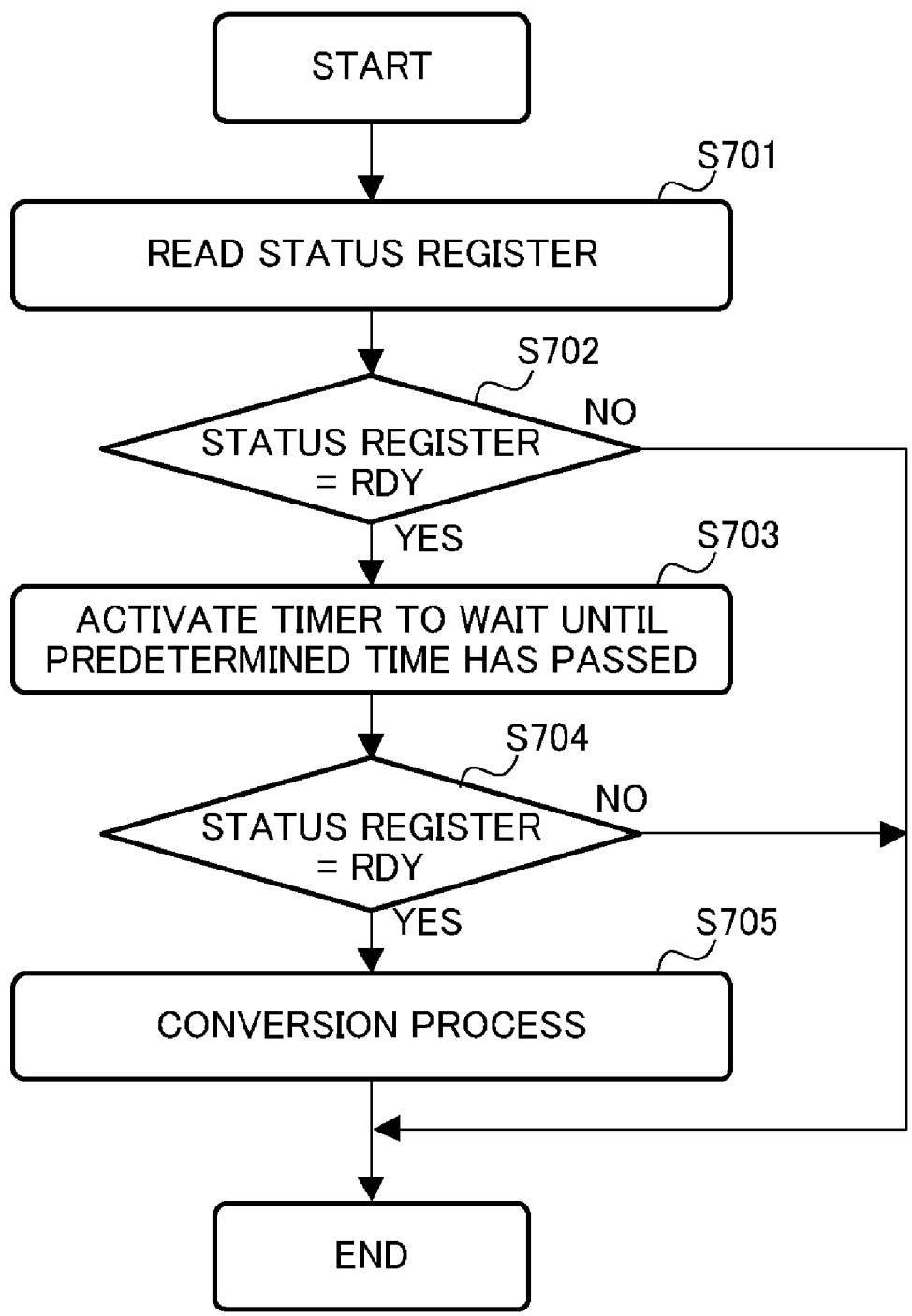
FIG. 16 is a flowchart illustrating the operation of a process of starting the conversion process when there is no command for a predetermined period of time.

FIG. 16 is a flowchart illustrating the operation of a process of starting the conversion process when there is no command for a predetermined period of time. First, the microprocessor 206 reads the value of a status register (S701) and makes a determination as to whether the value of the status register is RDY (S702).

When the value of the status register is RDY (S702, YES), the microprocessor 206 activates a timer to wait until a predetermined period of time has passed (S703). Then, the microprocessor 206 makes a determination as to whether the value of the status register is RDY (S704).

When the value of the status register is RDY (S704, YES), the microprocessor 206 performs the conversion process described below (S705).

When the value of the status register is not RDY (S704, NO), the microprocessor 206 ends the process.

When it is determined at step S702 that the value of the status register is not RDY (S702, NO), the microprocessor 206 ends the process.

Figure 17:
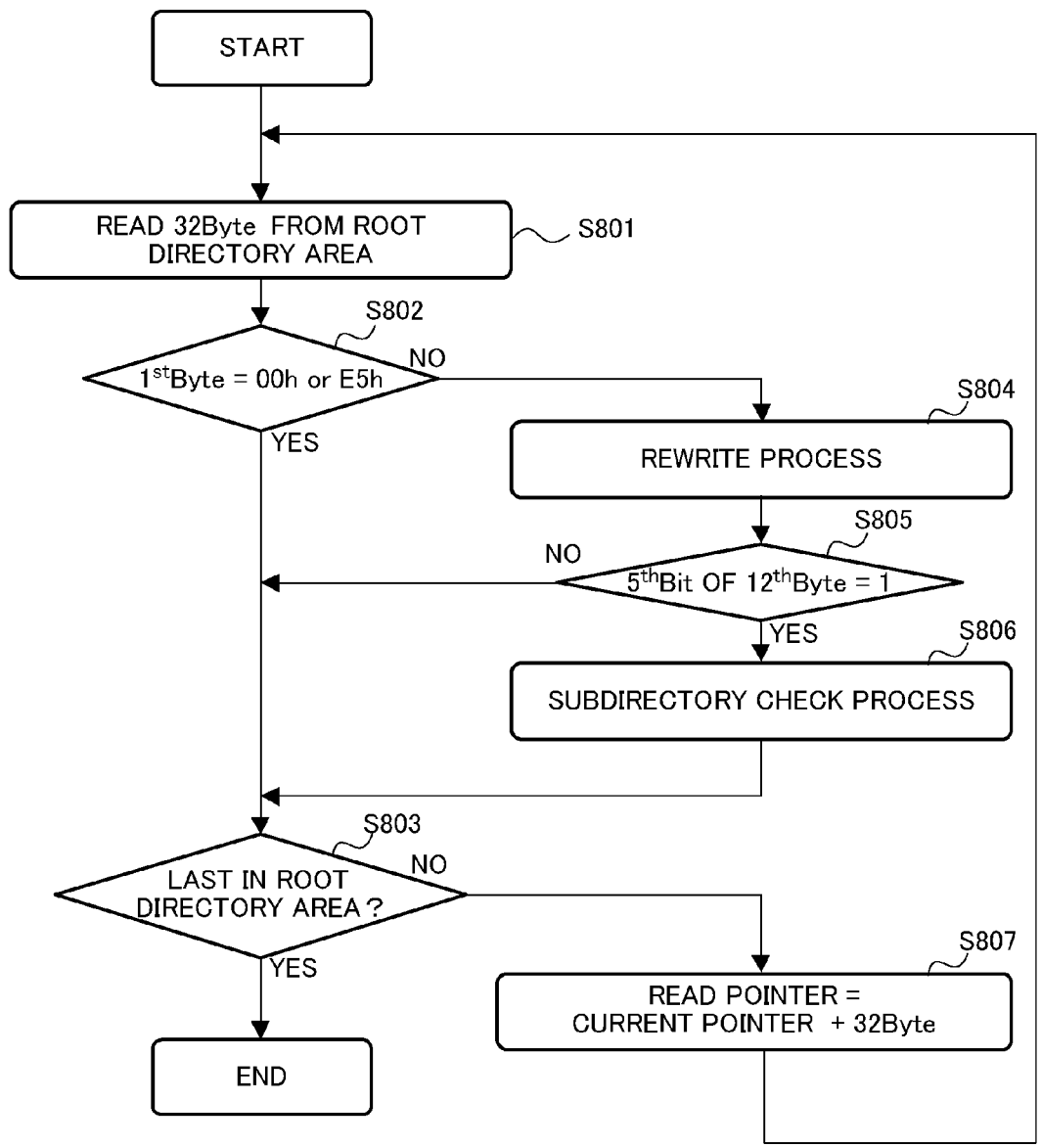
FIG. 17 is a flowchart illustrating the operation of the conversion process.

As illustrated in FIGS. 14 and 15, meeting a predetermined condition acts as a trigger for the microprocessor 206 to start the conversion process. FIG. 17 is a flowchart illustrating the operation of the conversion process at step S503 of FIG. 14, step S603 of FIG. 15 and step S705 of FIG. 16.

First, the microprocessor 206 reads 32 Byte from the root directory area of the NAND flash array 101 (S801) and makes a determination as to whether or not 1$^{st}$ Byte of the 32 Byte that the microprocessor 206 has read is 00h or E5h (S802).

When the 1$^{st}$ Byte is 00h or E5h (S802, YES), the microprocessor 206 makes a determination as to whether the 32 Byte that the microprocessor 206 has read is the last one in the root directory area (S803).

When the 32 Byte is the last one in the root directory area (S803, YES), the microprocessor 206 ends the process.

When the 32 Byte that the microprocessor 206 has read is not the last one in the root directory area (S803, NO), the microprocessor 206 obtains a read pointer by adding 32 bytes to the current pointer (S807) and reads another 32 Byte from the root directory area again (S801).

When it is determined at step S802 that the 1$^{st}$ Byte is not 00h or E5h (S802, NO), the microprocessor 206 performs a rewrite process described below (S804) and makes a determination as to whether 5$^{th}$ bit of the 12$^{th}$ Byte is 1 (S805).

When the 5$^{th}$ bit of the 12$^{th}$ Byte is 1 (S805, YES), the microprocessor 206 performs a subdirectory check process described below (S806) and makes a determination as to whether the 32 Byte that the microprocessor 206 has read is the last one in the root directory area (S803).

When the 5$^{th}$ bit of the 12$^{th}$ Byte is not 1 (S805, NO), the microprocessor 206 makes a determination as to whether the 32 Byte that the microprocessor 206 has read is the last one in the root directory area (S803).

Figure 18:
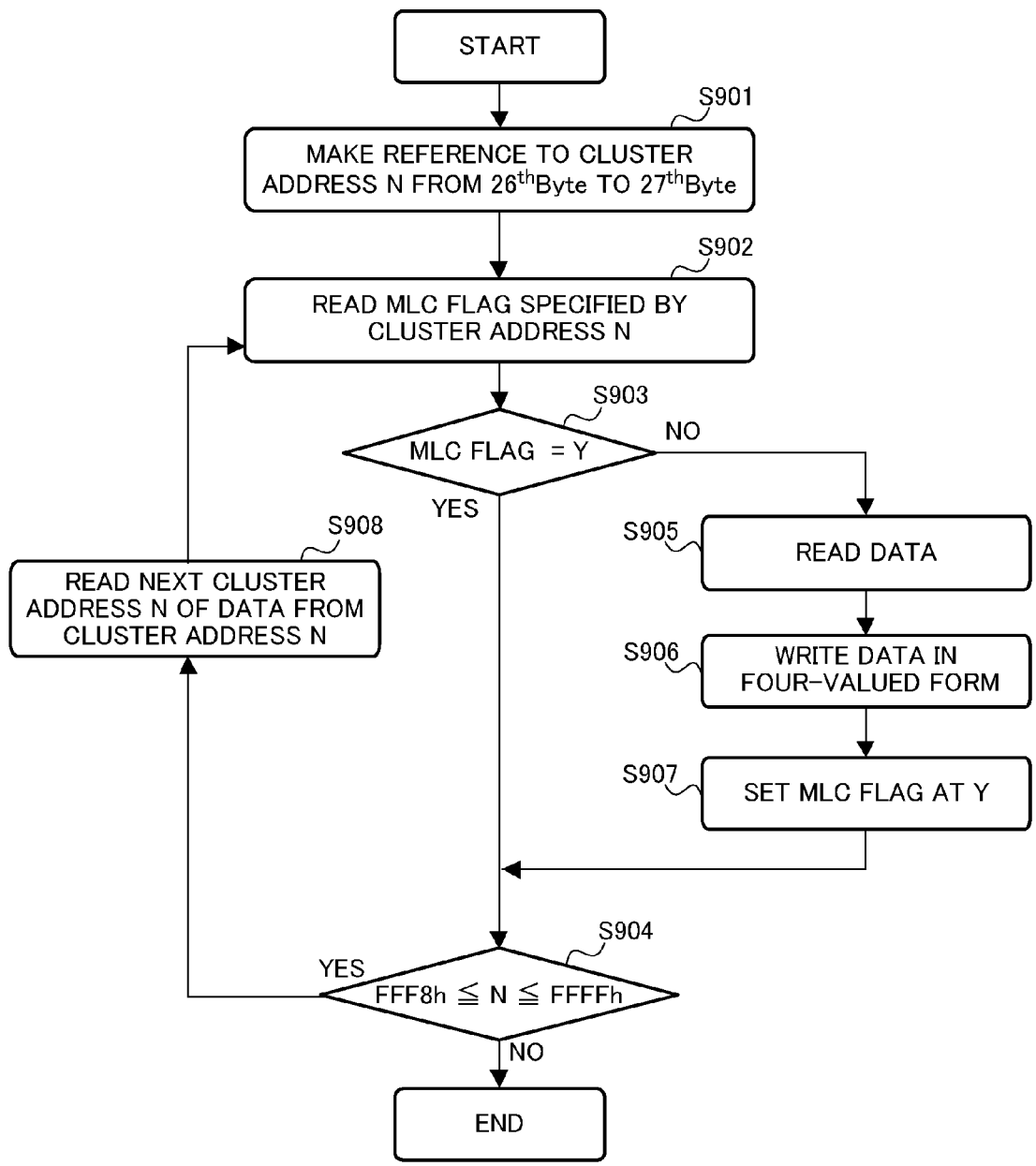
FIG. 18 is a flowchart illustrating the operation of a rewrite process.

The following describes the operation of a rewrite process in the above conversion process. FIG. 18 is a flowchart illustrating the operation of the rewrite process. Incidentally, suppose that before the process described below is performed at step S804 of FIG. 17, the 32 Byte has been already read from the root directory area.

First, the microprocessor 206 makes reference to a cluster address N from $26^{th}$ Byte to $27^{th}$ Byte (S901), reads the MLC flag of the data specified by the cluster address N (S902), and makes a determination as to whether the MLC flag is Y (S903).

When the MLC flag is Y (S903, YES), the microprocessor 206 makes a determination as to whether the cluster address N is greater than or equal to FFF8h and less than or equal to FFFFh to indicate the last cluster (S904).

When the cluster address N is not greater than or equal to FFF8h and less than or equal to FFFFh (S904, YES), the microprocessor 206 reads the next cluster address N of the data from the cluster address N (S908) and reads the MLC flag again (S902).

When the cluster address N is greater than or equal to FFF8h and not less than or equal to FFFFh (S904, NO), the microprocessor 206 ends the process.

When it is determined at step S903 that the MLC flag is not Y (S903, NO), the microprocessor 206 makes the sense amplifier/comparator circuit 104 read data from the flash array through the NAND interface unit 205; stores in the input/output buffer 107 the data that the sense amplifier/comparator circuit 104 has read; writes the data to the NAND flash array 101 in four-valued form (S906); sets the MLC flag at Y (S907); and makes a determination as to whether the cluster address N is greater than or equal to FFF8h and less than or equal to FFFFh to indicate the last cluster (S904).

Figure 19:
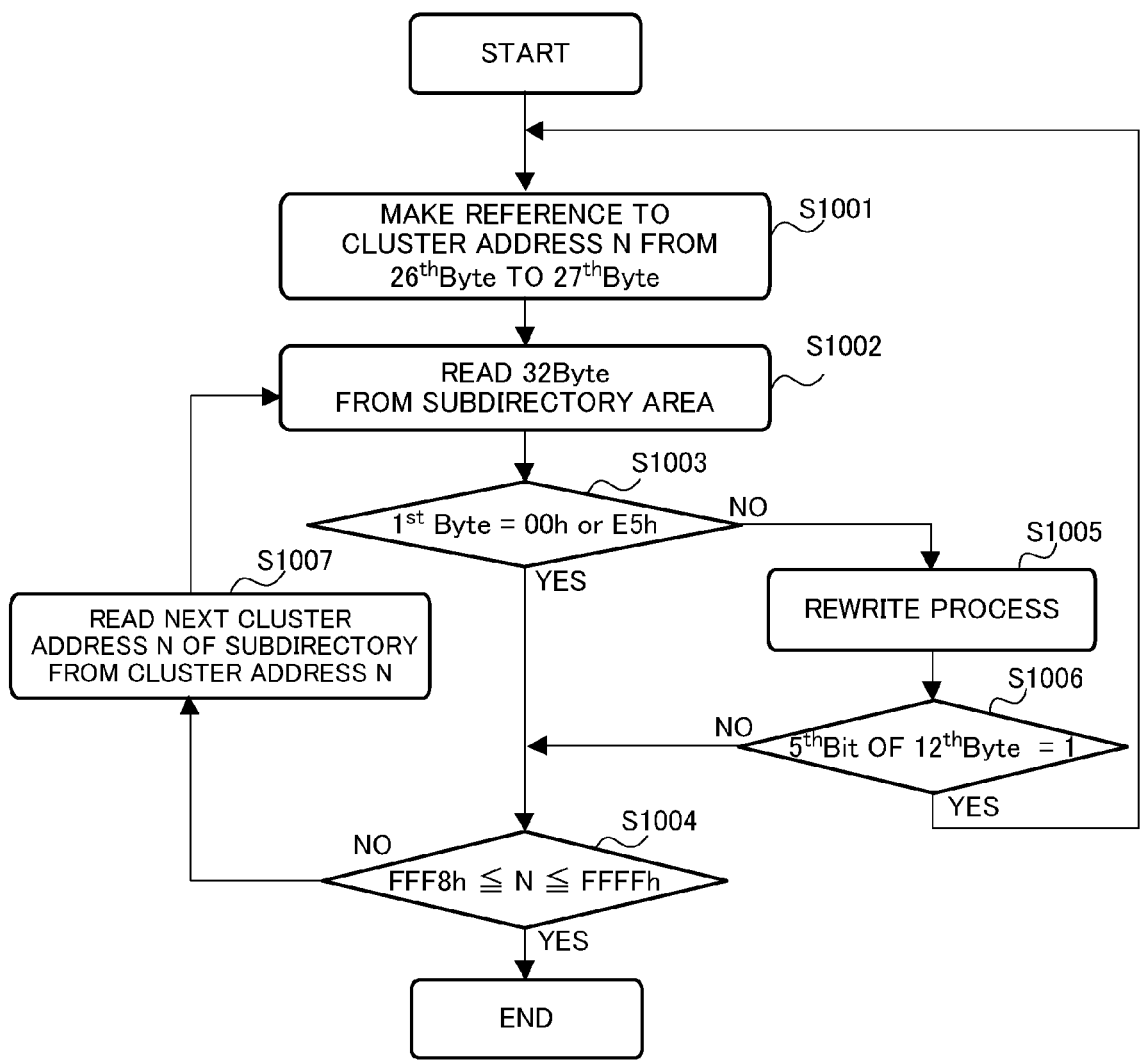
FIG. 19 is a flowchart illustrating the operation of a subdirectory check process.

The following describes the operation of the subdirectory check process in the above conversion process. FIG. 19 is a flowchart illustrating the operation of the subdirectory check process. Incidentally, suppose that before the process described below is performed at step S806 of FIG. 17, the 32 Byte has been already read from the root directory area or from a subdirectory area of FIG. 19.

First, the microprocessor 206 makes reference to a cluster address N from the $26^{th}$ Byte to $27^{th}$ Byte (S1001), reads 32 Byte from a subdirectory area specified by the cluster address N (S1002), and makes a determination as to whether or not $1^{st}$ Byte is 00h or E5h (S1003).

When the $1^{st}$ Byte is 00h or E5h (S1003, YES), the microprocessor 206 makes a determination as to whether the cluster address N is greater than or equal to FFF8h and less than or equal to FFFFh (S1004).

When the cluster address N is greater than or equal to FFF8h and less than or equal to FFFFh (S1004, YES), the microprocessor 206 ends the process.

When the cluster address N is not greater than or equal to FFF8h and not less than or equal to FFFFh (S1004, NO), the microprocessor 206 reads the next cluster address N of the subdirectory from the cluster address N (S1007) and reads 32 Byte from the subdirectory area again (S1002).

When it is determined at step S1003 that the $1^{st}$ Byte is not 00h or E5h (S1003, NO), the microprocessor 206 performs the above rewrite process (S1005) and makes a determination as to whether $5^{th}$ bit of the $12^{th}$ Byte is 1 (S1006).

When the $5^{th}$ bit of the $12^{th}$ Byte is 1 (S1006, YES), the microprocessor 206 reads the cluster address N of the next subdirectory from the $26^{th}$ Byte to $27^{th}$ Byte (S1001).

When the $5^{th}$ bit of the $12^{th}$ Byte is not 1 (S1006, NO), the microprocessor 206 makes a determination as to whether the cluster address N is greater than or equal to FFF8h and less than or equal to FFFFh (S1004).

According to the above process, the NAND flash memory 10 can rewrite the data, which is originally written in binary form, in four-valued form. Incidentally, the above has described how the data written in binary form is rewritten in four-valued form. It is also possible that the data written in four-valued form is rewritten in binary form.

Figure 20:
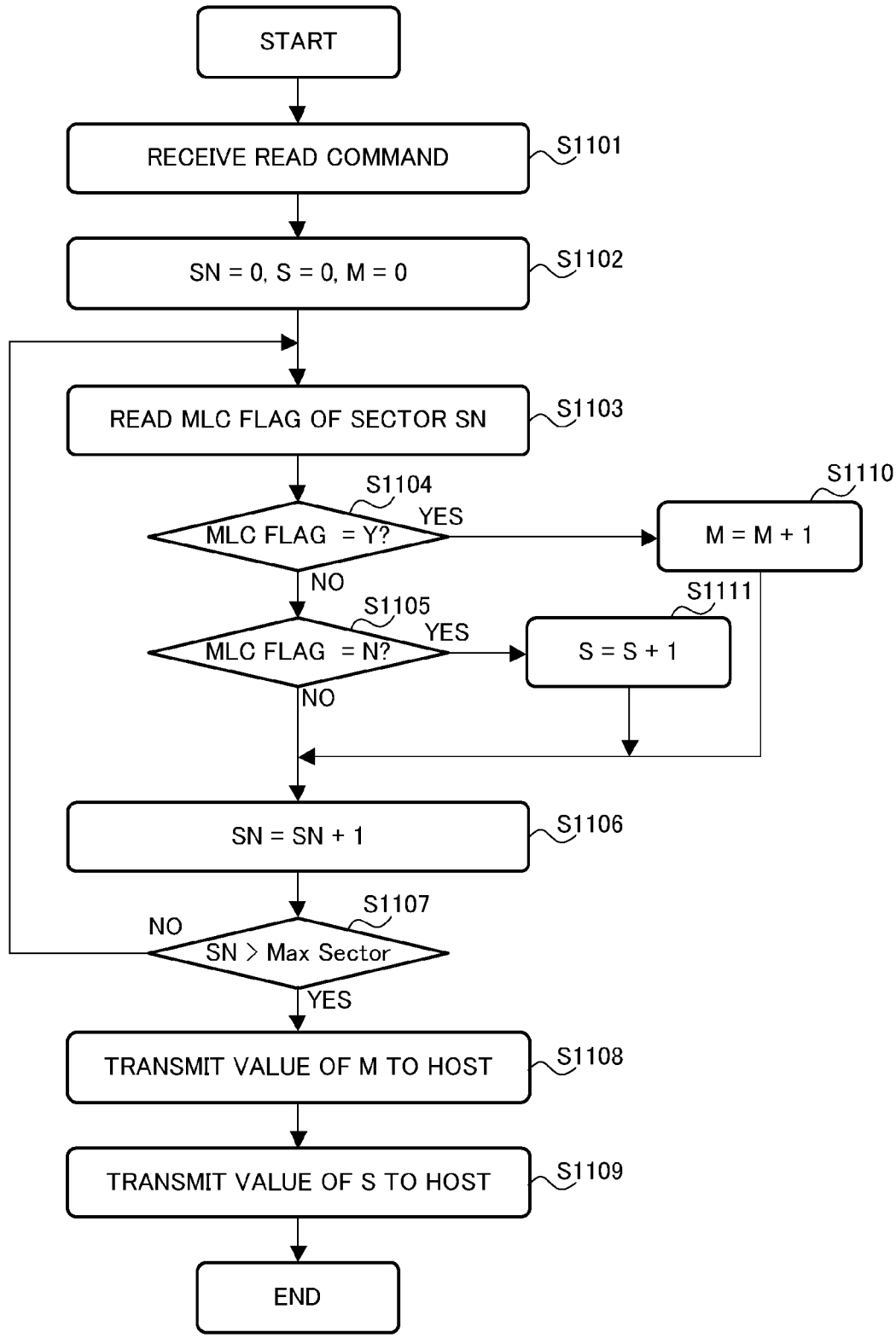
FIG. 20 is a flowchart illustrating the operation of a process of transmitting usage amounts of binary and multiple-valued modes.

The following describes a process of transmitting to the host a usage amount of the NAND flash memory, or information about how much of the NAND flash memory is used, according to the present embodiment. FIG. 20 is a flowchart illustrating the operation of a process of transmitting the usage amounts of binary and multiple-valued modes.

After receiving a read command from the host through the host interface unit 201 (S1101), the microprocessor 206 sets the following variables at 0 (S1102): variable SN that is used to count LSN, variable S that is used to count the number of sectors where data is saved in binary form, and variable M that is used to count the number of sectors where data is saved in four-valued form. The microprocessor 206 then reads the MLC flag of LSNSN through the NAND interface unit 205 (S1103) and makes a determination as to whether the MLC flag is Y (S1104).

When the MLC flag is not Y (S1104, NO), the microprocessor 206 makes a determination as to whether the MLC flag is N (S1105).

When the MLC flag is not N (S1105, NO), the microprocessor 206 adds 1 to the variable SN (S1106) and makes a determination as to whether the value of the variable SN is greater than the maximum number of sectors of the NAND flash array 101 (S1107).

When the value of the variable SN is greater than the maximum number of sectors of the NAND flash array 101 (S1107, YES), the microprocessor 206 transmits the value of the variable M to the host through the host interface unit 201 (S1108) and also transmits the value of the variable S to the host through the host interface unit 201 (S1109).

When the value of the variable SN is less than or equal to the maximum number of sectors of the NAND flash array 101 (S1107, NO), the microprocessor 206 reads the MLC flag of LSNSN again through the NAND interface unit 205 (S1103). When it is determined at step S1105 that the MLC flag is N (S1105, YES), the microprocessor 206 adds 1 to the variable S (S1111) and also adds 1 to the variable SN (S1106).

When it is determined at step S1104 that the MLC flag is Y (S1104, YES), the microprocessor 206 adds 1 to the variable M (S1110) and also adds 1 to the variable SN (S1106).

Figure 21:
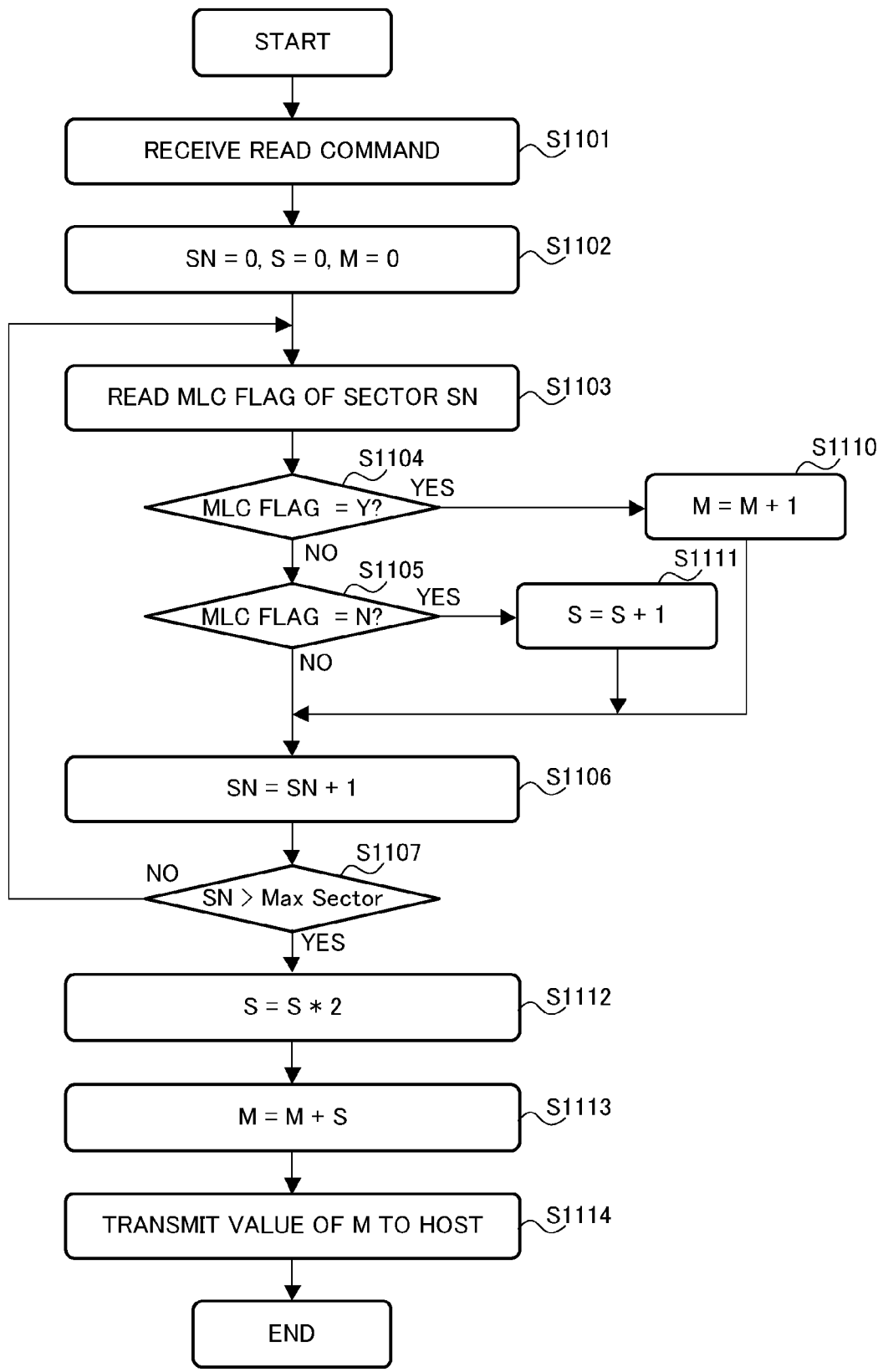
FIG. 21 is a flowchart illustrating the operation of a process of converting a binary usage amount to a multiple-valued usage amount and transmitting the converted usage amount to the host.

As described above, the number of sectors where data is written in binary form and the number of sectors where data is written in four-valued form are transmitted. Therefore, the host can calculate the usage amounts of the NAND flash memory 10 for binary and four-valued data on the basis of the variables M and S and the amount of information in the sectors. Moreover, according to the present embodiment, the NAND flash memory 10 can convert the binary usage amount to the multiple-valued usage amount and transmit the converted usage amount to the host. FIG. 21 is a flowchart illustrating the operation of a process of converting the binary usage amount to the multiple-valued usage amount and transmitting the converted usage amount to the host. Incidentally, the processes of steps S1101 to S1111 are the same as those of FIG. 20 and thus will not be described here. Described below are the processes of steps S1112 to S1114.

When it is determined at step S1107 that the value of the variable SN is greater than the number of sectors of the NAND flash array 101 (S1107, YES), the microprocessor 206 doubles the value of the variable S (S1112), adds the value of the variable S to the value of the variable M (S1113) and transmits the value of the variable M to the host through the host interface unit 201 (S1114).

As described above, it is possible to calculate the four-valued usage amount by doubling the number of sectors where data is stored in binary form and adding the resultant figure to the number of sectors where data is stored in four-valued form. Moreover, it is possible to calculate the binary usage amount by dividing the number of sectors where data is stored in four-valued form by 2 and adding the resultant figure to the number of sectors where data is stored in binary form.

Figure 22:
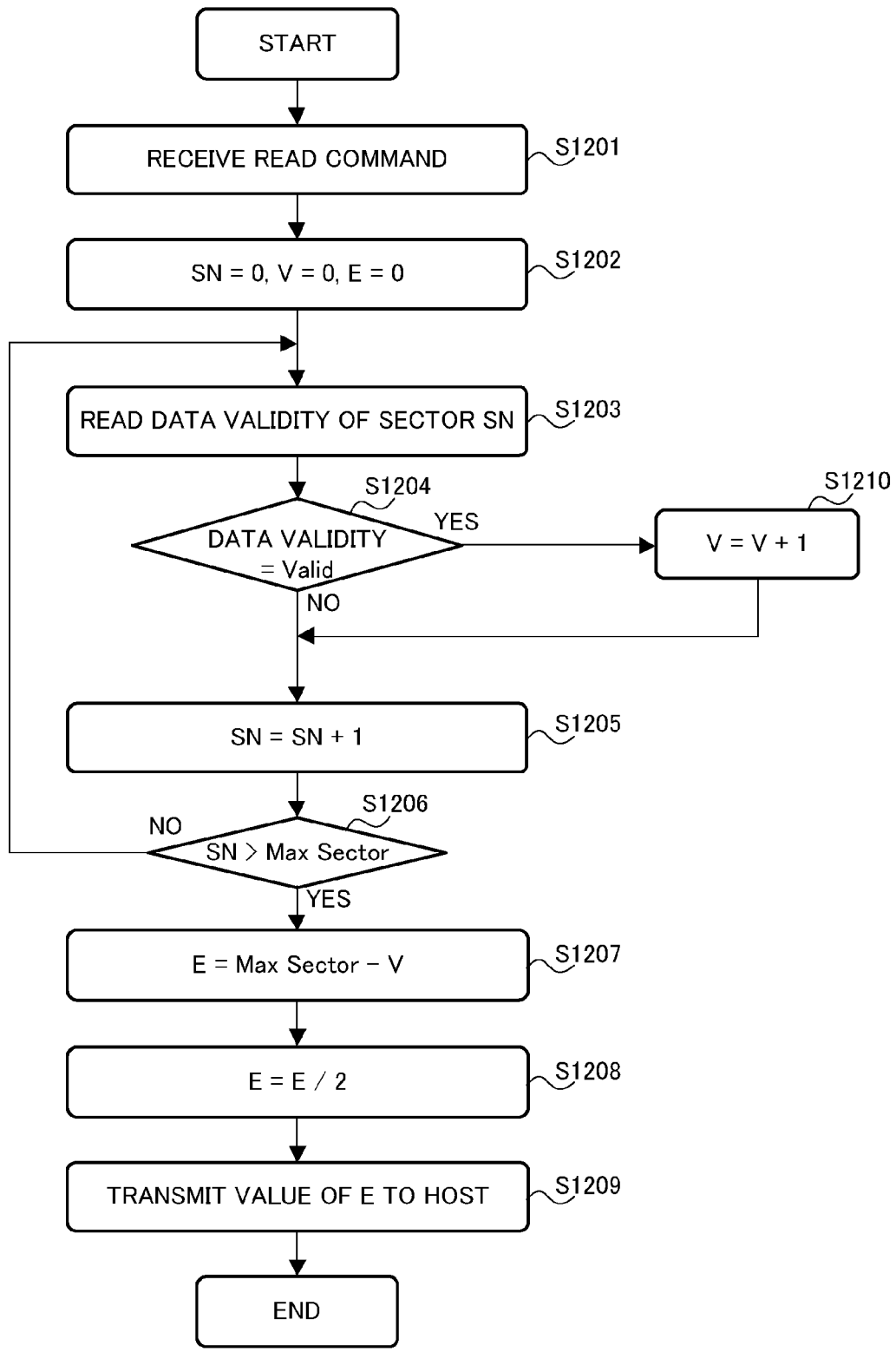
FIG. 22 is a flowchart illustrating the operation of a free space calculation process.

The following describes a free space calculation process. FIG. 22 is a flowchart illustrating the operation of the free space calculation process.

After receiving a read command from the host through the host interface unit 201 (S1201), the microprocessor 206 sets the following variables at 0 (S1202): variable SN that is used to count LSN, variable V that is used to count the number of sectors where Data Validity is valid, and variable E that indicates the amount of free space. The microprocessor 206 then reads the Data Validity of LSNSN through the NAND interface unit 205 (S1203) and makes a determination as to whether the Data Validity is valid (S1204).

When the Data Validity is not valid (S1204, NO), the microprocessor 206 adds 1 to the variable SN (S1205) and makes a determination as to whether the value of the variable SN is greater than the total number of sectors of the NAND flash array 101 (S1106).

When the value of the variable SN is greater than the maximum number of sectors of the NAND flash array 101 (S1206, YES), the microprocessor 206 subtracts the value of V from the maximum number of sectors and regards the resultant figure as the number of E (S1207), divides the value of E by 2 (S1208), and transmits the value of E to the host (S1209).

When the value of the variable SN is less than or equal to the maximum number of sectors of the NAND flash array 101 (S1206, NO), the microprocessor 206 reads Data Validity of LSNSN again through the NAND interface unit 205 (S1203).

When the Data Validity is valid at step S1204 (S1204, YES), the microprocessor 206 adds 1 to the value of V (S1210) and also adds 1 to the value of SN (S1205).

Figure 23:
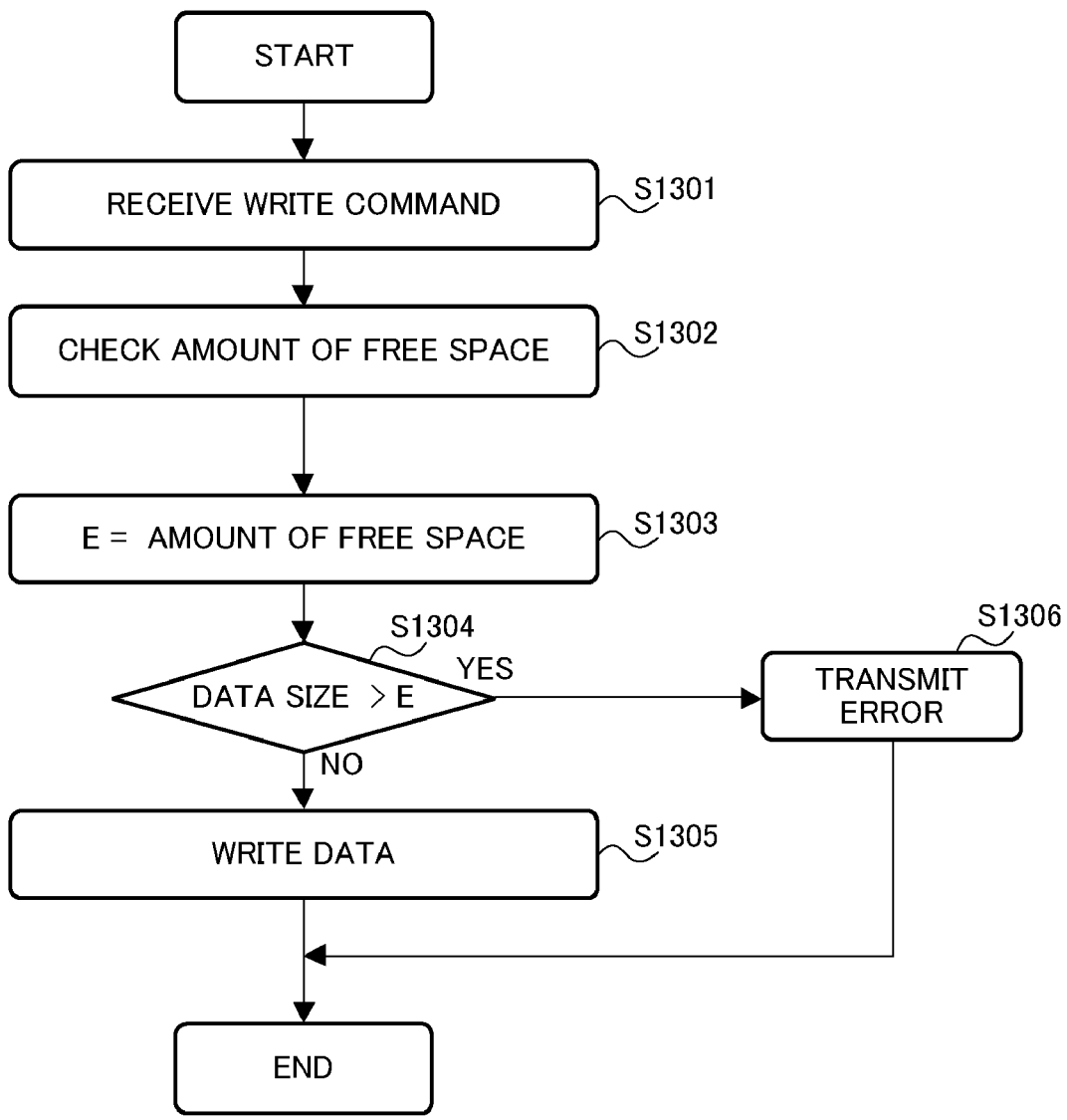
FIG. 23 is a flowchart illustrating the operation of a process of returning an error for data of a size greater than or equal to the amount of free space.

According to the above operation, the NAND flash memory 10 can calculate the amount of free space when data is written in binary form in the NAND flash array 101. Based on the amount of free space when data is written in binary form, the NAND flash memory 10 can transmit an error to the host when data of a size greater than or equal to the amount of free space is written in binary form. FIG. 23 is a flowchart illustrating the operation of a process of returning an error for data of a size greater than or equal to the amount of free space.

First, the microprocessor 206 receives a write command from the host through the host interface unit 201 (S1301), checks the amount of free space (S1302), substitutes the amount of free space for the variable E (S1303), and makes a determination as to whether the size of data transmitted from the host is greater than the value of E (S1304).

When the size of the data transmitted from the host is less than or equal to the value of E (S1304, NO), the microprocessor 206 writes the data to the NAND flash array 101 through the NAND interface unit 205 (S1305).

When the size of the data transmitted from the host is greater than the value of E (S1304, YES), the microprocessor 206 transmits an error to the host through the host interface unit 201 (S1306).

According to the above operations, the NAND flash memory 10 of the present embodiment can switch between binary and four-valued modes in writing data on the basis of the attribute information of the data.

Figure 24:
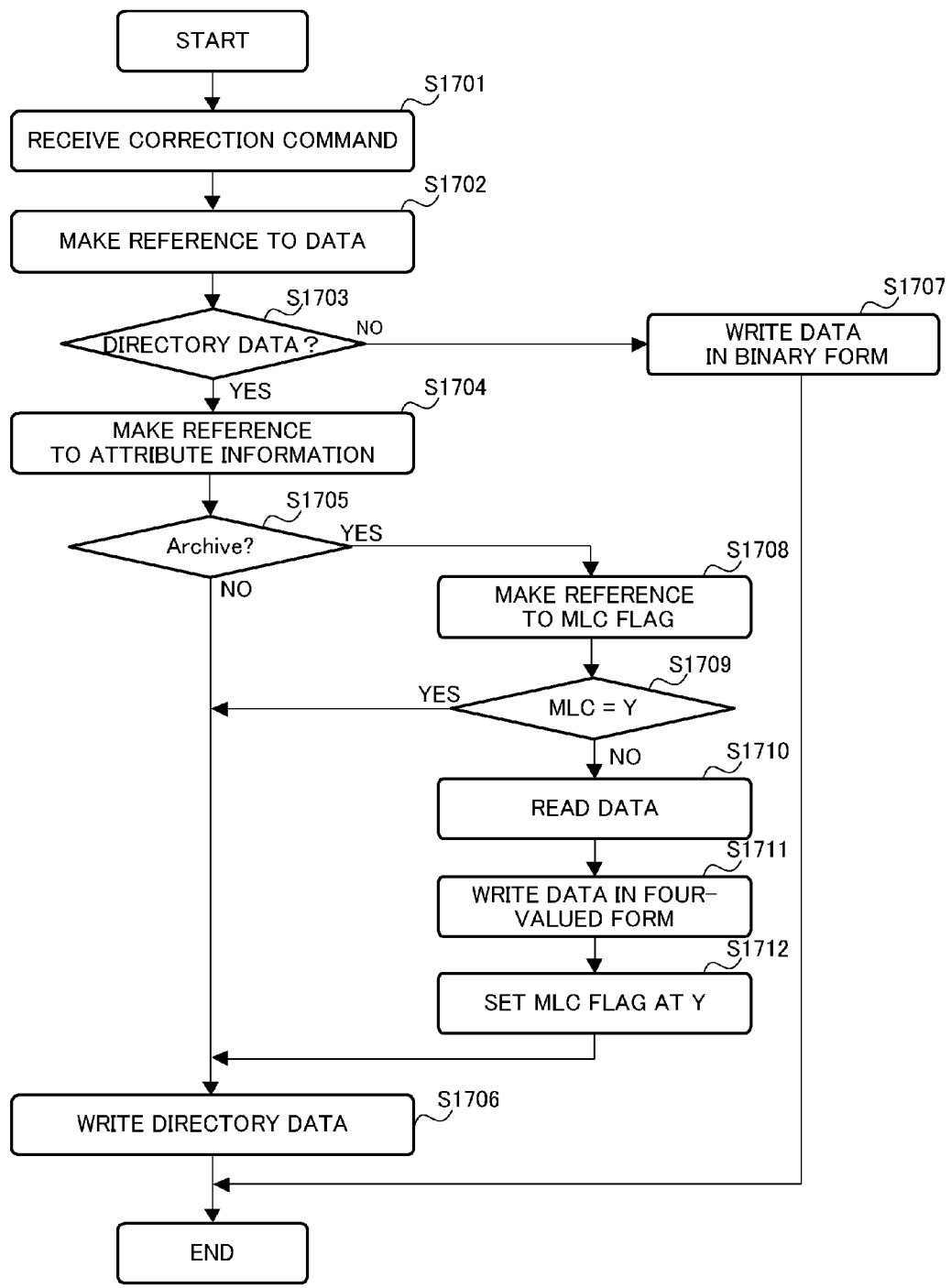
FIG. 24 is a flowchart illustrating the operation of a threshold correction process.

The following describes a threshold correction process. For example, when a certain attribute that is preset in binary form is set in four-valued form and there is an inconsistency in a current setting for data previously written, the threshold correction process rewrites the data, which is originally written in binary form, in four-valued form on the basis of the attribute and MLC flag of the data written and a current setting table. FIG. 24 is a flowchart illustrating the operation of the threshold correction process.

First, the microprocessor 206 receives a correction command from the host through the host interface unit 201 (S1701), makes reference to data written in the NAND flash array 101 (S1702), and makes a determination as to whether the data is directory data (S1703).

When the data is directory data (S1703, YES), the microprocessor 206 makes reference to the attribute information of the data (S1704) and makes a determination as to whether the attribute in the current setting indicates that the data is going to be written in four-valued form, i.e. the attribute is Archive (S1705; a threshold conversion step).

When the attribute is not Archive (S1705, NO), the microprocessor 206 allows the directory data to be written in the NAND flash array 101 (S1706).

When the attribute is Archive (S1705, YES), the microprocessor 206 makes reference to the MLC flag of the data (S1708; the threshold conversion step) and makes a determination as to whether the MLC flag is set at Y (S1709; the threshold conversion step).

When the MLC flag is not set at Y (S1709, NO), the microprocessor 206 stores in the input/output buffer 107 the data that is written to the NAND flash array 101 (S1710), allows the stored data to be written to the NAND flash array 101 in four-valued form (S1711; the threshold conversion step), sets the MLC flag of the data written at Y (S1712), and writes the directory data to the NAND flash array 101 (S1706).

When the MLC flag is set at Y (S1709, YES), the microprocessor 206 allows the directory data to be written to the NAND flash array 101 (S1706).

When it is determined at step S1703 that the data is not directory data, the microprocessor 206 allows the data to be written to the NAND flash array 101 in binary form (S1707).

As described above, since the attribute and the MLC flag are compared, the data is saved in the NAND flash array 101 in such a way that the values of the data conform to the current setting after the setting of the attribute information is changed from the binary mode, in which data is written in binary form, to the four-valued mode, in which data is written in four-valued form. Incidentally, FIG. 24 illustrates the case in which the binary data is rewritten in four-valued form. If there is data that is preferably in binary form but actually written in four-valued form, the four-valued data is similarly read out and then saved in the NAND flash array 101 in binary form.

Second Embodiment

Figure 25:
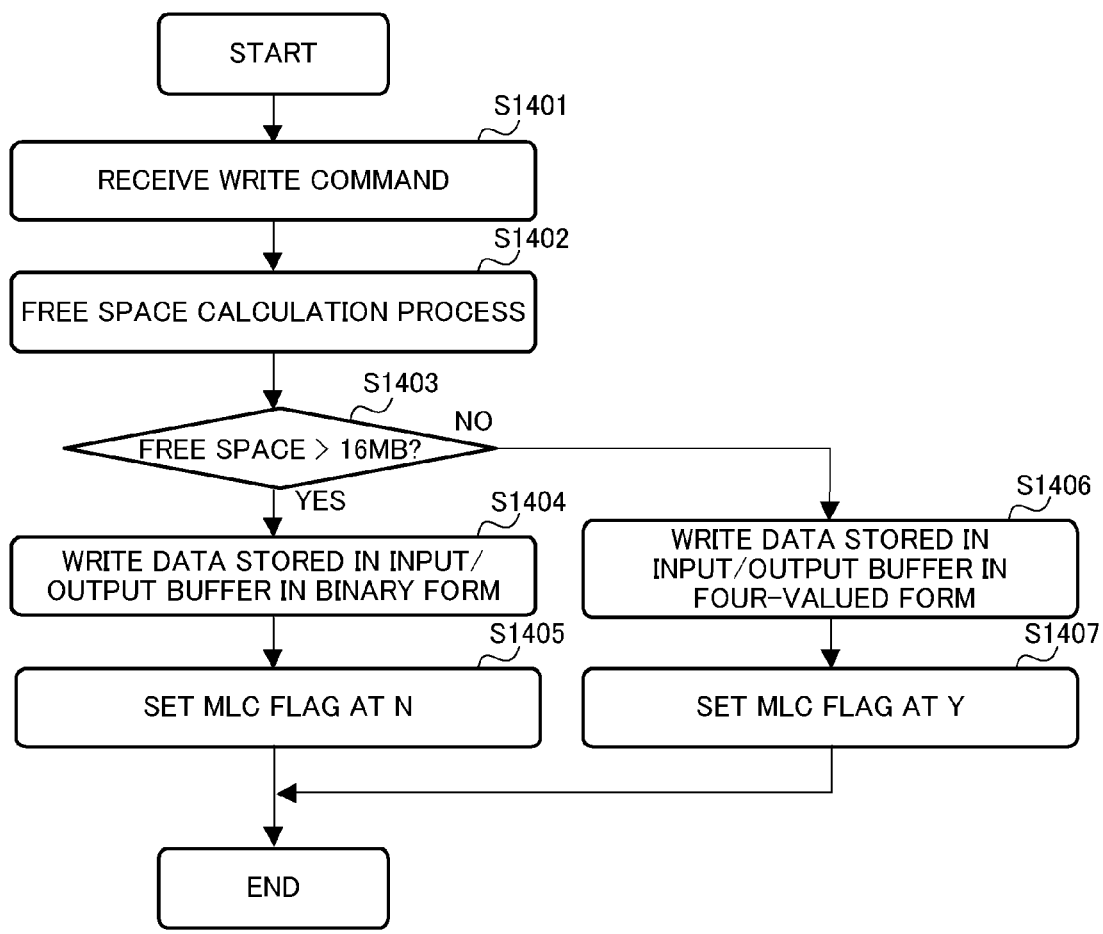
FIG. 25 is a flowchart illustrating the operation of a write process according to a second embodiment.

The NAND flash memory of the first embodiment switches between binary and four-valued modes on the basis of the attribute information. A NAND flash memory of the present embodiment switches between binary and four-valued modes on the basis of the amount of free space on the NAND flash array. Incidentally, the NAND flash memory of the present embodiment and the NAND flash memory of the first embodiment are the same in configuration but different only in operation. The following descries an operation that is different from that of the NAND flash memory of the first embodiment. FIG. 25 is a flowchart illustrating the operation of a write process according to the second embodiment. Incidentally, according to the present embodiment, the capacity of the NAND flash memory is 32 MB in binary mode; when the amount of free space becomes less than or equal to 16 MB in binary mode, the NAND flash memory switches from the binary mode to the four-valued mode in which values are written to cells in four-valued form.

After receiving a write command from the host through the host interface unit 201 (S1401), the microprocessor 206 performs the free space calculation process as illustrated in FIG. 22 (S1402) and makes a determination as to whether the amount of free space is greater than 16 MB (S1403; the threshold determination step).

When the amount of free space is greater than 16 MB (S1403, YES), the microprocessor 206 allows data stored in the input/output buffer 107 to be written to the NAND flash array in binary form (S1404; the write step) and sets the MLC flag of the spare that is redundant data of the sector of the data written to the NAND flash array 101 at N (S1405).

When the amount of free space is less than or equal to 16 MB (S1403, NO), the microprocessor 206 allows the data stored in the input/output buffer 107 to be written to the NAND flash array in four-valued form (S1406; the write step) and sets the MLC flag of the spare that is redundant data of the sector of the data written to the NAND flash array 101 at Y (S1407).

According to the above operation, the NAND flash memory 10 of the present embodiment switches between binary and four-valued modes on the basis of the amount of free space. When the amount of free space is greater than a predetermined amount, data is written in binary form to secure a high level of reliability. When the amount of free space is less than or equal to the predetermined amount, data is written in four-valued form so that much more data can be saved. Therefore, it is possible to achieve a high level of reliability and a large capacity at the same time.

Third Embodiment

Figure 26:
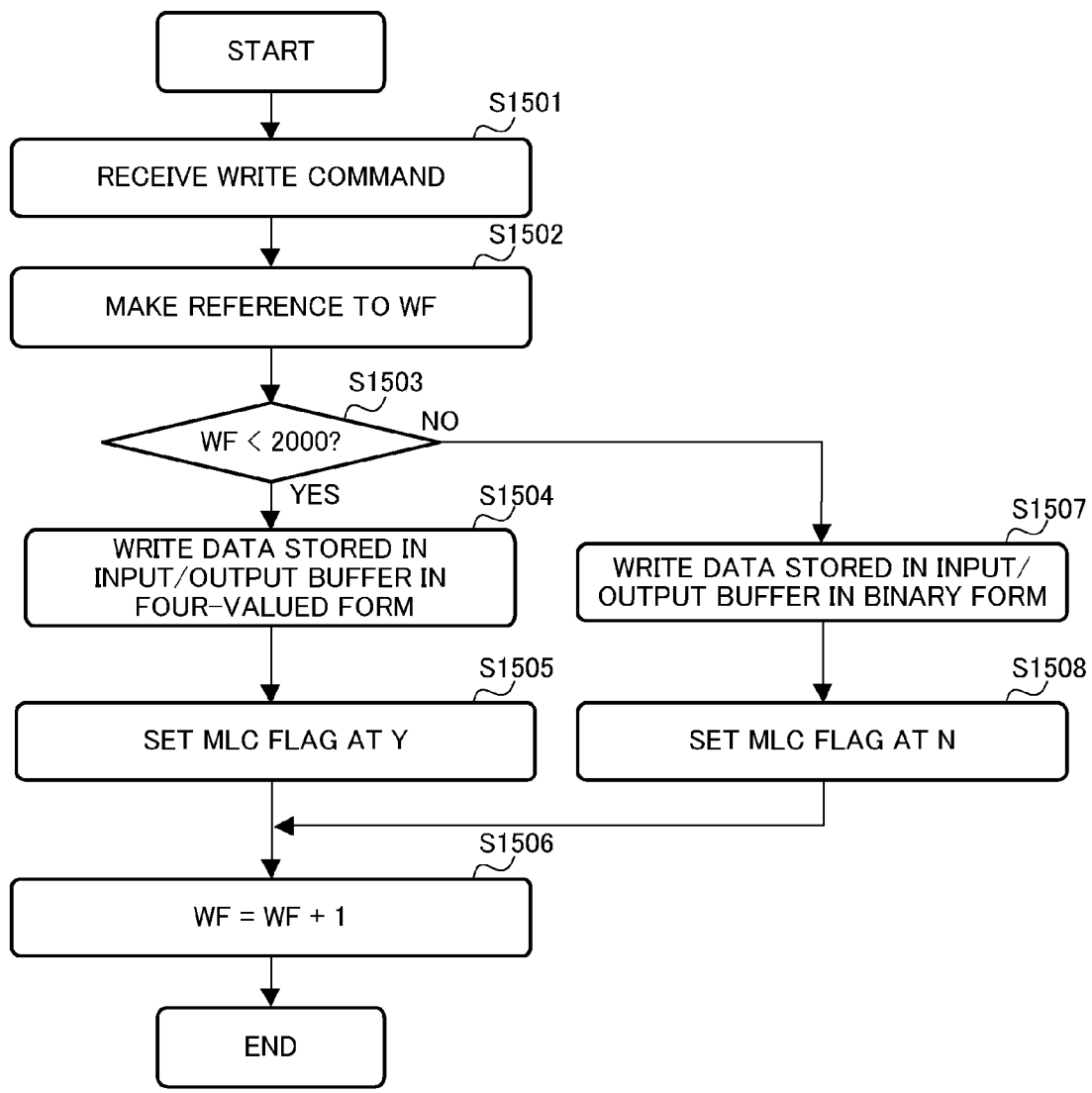
FIG. 26 is a flowchart illustrating the operation of a write process according to a third embodiment.

The NAND flash memory of the second embodiment switches between binary and four-valued modes on the basis of the amount of free space. A NAND flash memory of the present embodiment switches between binary and four-valued modes on the basis of the number of times data is written to cells of the NAND flash array. Incidentally, the NAND flash memory of the present embodiment and the NAND flash memories of the first and second embodiments are the same in configuration but different only in operation. The following descries an operation that is different from that of the NAND flash memory of the second embodiment. FIG. 26 is a flowchart illustrating the operation of a write process according to the third embodiment. Incidentally, according to the present embodiment, for reasons of explanation, the number of times data is written to the NAND flash memory is limited to 4000. Suppose data is written in four-valued form when the number of times data is written to the NAND flash memory is less than 2000 and that the NAND flash memory switches from the four-valued mode to the binary mode in which values are written to cells in binary form when the number becomes greater than or equal to 2000.

After receiving a write command from the host through the host interface unit 201 (S1501), the microprocessor 206 makes reference to WF, which is information indicating the number of times data is written as illustrated in FIG. 8 (S1502). The microprocessor 206 makes a determination as to whether the number of times data is written is less than 2000 (S1503; the threshold determination step).

When the number is less than 2000 (S1503, YES), the microprocessor 206 allows data stored in the input/output buffer 107 to be written to the NAND flash array in four-valued form (S1504; the write step); sets the MLC flag of the spare that is redundant data of the sector of the data written to the NAND flash array 101 at Y (S1505); and adds 1 to MF (S1506).

When the number is greater than or equal to 2000 (S1503, NO), the microprocessor 206 allows the data stored in the input/output buffer 107 to be written to the NAND flash array in binary form (S1507; the write step); sets the MLC flag of the spare that is redundant data of the sector of the data written to the NAND flash array 101 at Y (S1508); and adds 1 to MF (S1506).

According to the above operation, the NAND flash memory 10 of the present embodiment switches between binary and four-valued modes on the basis of the number of times data is written. Accordingly, data is written in four-valued form to cells where data has not been written many times; data is written in binary form to cells where data has been written so many times, or cells whose quality has deteriorated, to secure a high level of reliability. Therefore, it is possible to achieve a high level of reliability and a large capacity at the same time.

Fourth Embodiment

Figure 27:
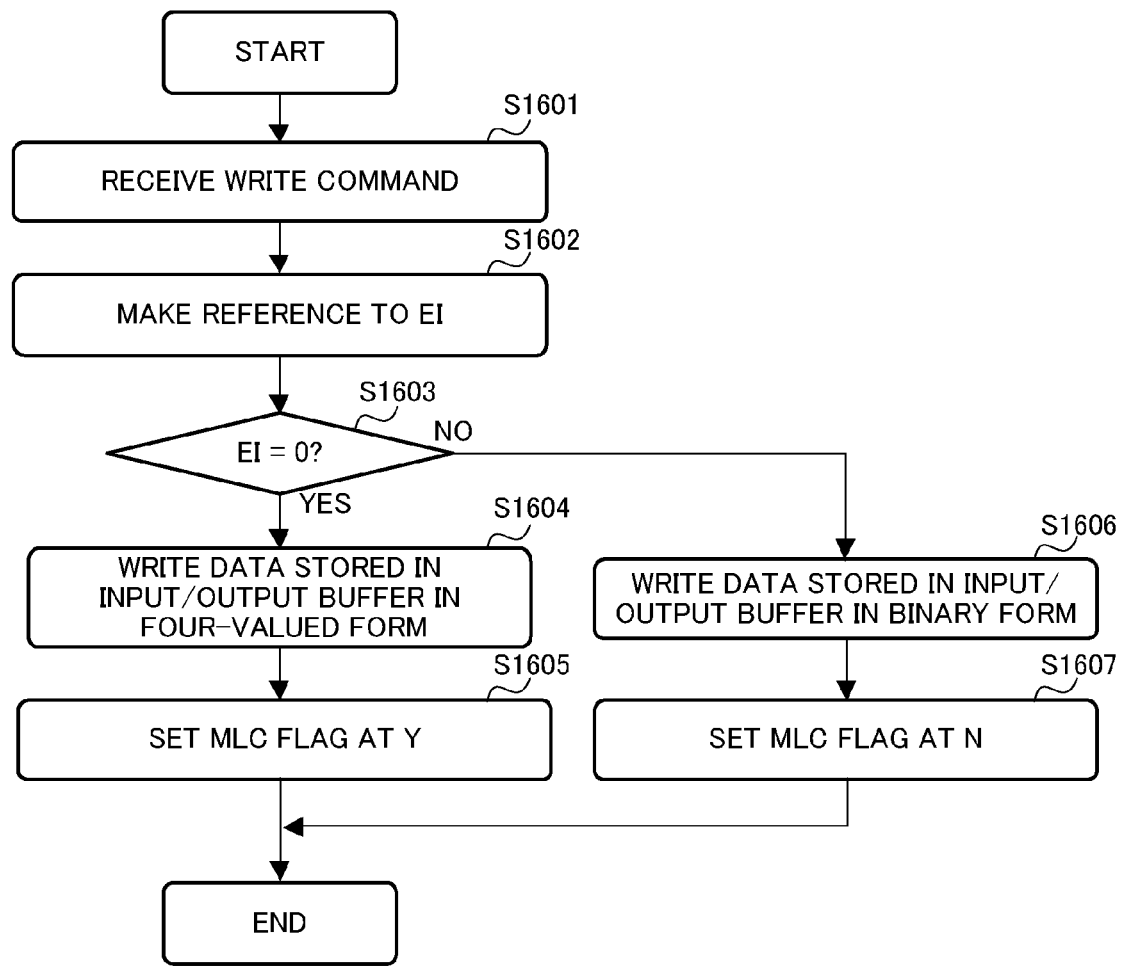
FIG. 27 is a flowchart illustrating the operation of a write process according to a fourth embodiment.
Figure 28:
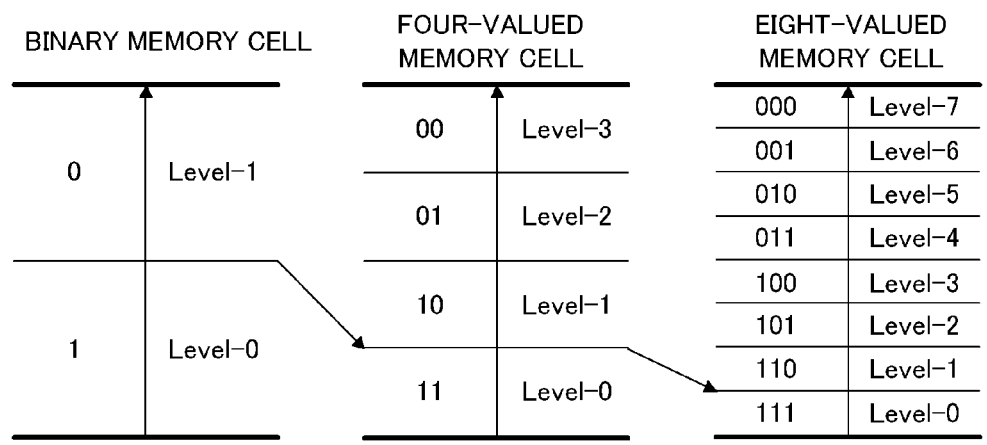
FIG. 28 is a diagram illustrating bits saved in a binary memory cell, a four-valued memory cell and an eight-valued memory cell.

The NAND flash memory of the third embodiment switches between binary and four-valued modes on the basis of the number of times data is written. A NAND flash memory of the present embodiment switches between binary and four-valued modes on the basis of an error state of cells of the NAND flash array. Incidentally, the NAND flash memory of the present embodiment and the NAND flash memories of the first to third embodiments are the same in configuration but different only in operation. The following descries an operation that is different from that of the NAND flash memory of the third embodiment. FIG. 27 is a flowchart illustrating the operation of a write process according to the fourth embodiment. Incidentally, according to the present embodiment, the error is an error returned from the sense amplifier/comparator circuit during the above process of reading data. After receiving the error the microprocessor 206 sets EI of the spare that is redundant data of the sector that has received the error at 1.

After receiving a write command from the host through the host interface unit 201 (S1601), the microprocessor 206 makes reference to the EI, which is information indicating the error state as illustrated in FIG. 8 (S1602). The microprocessor 206 makes a determination as to whether the EI is 0 (S1603; the threshold determination step).

When the EI is 0 (S1603, YES), the microprocessor 206 allows data stored in the input/output buffer 107 to be written to the NAND flash array in four-valued form (S1604; the write step) and sets the MLC flag of the spare that is redundant data of the sector of the data written to the NAND flash array 101 at Y (S1605).

When the EI is not 0 (S1603, NO), the microprocessor 206 allows the data stored in the input/output buffer 107 to be written to the NAND flash array in binary form (S1606; the write step) and sets the MLC flag of the spare that is redundant data of the sector of the data written to the NAND flash array 101 at N (S1507).

According to the above operation, the NAND flash memory 10 of the present embodiment writes data in four-valued form to cells where there are no errors, while writing data in binary form to cells where there are errors, i.e. cells whose quality has deteriorated. Therefore, it is possible to achieve a high level of reliability and a large capacity at the same time.

Incidentally, according to the above first to fourth embodiments, the processes described above are performed by the processor 206 of the control IC 20. However, the processes may be performed by the CPU the information processing device 1 is equipped with. In this case, various parameters, which are the results of processing, are temporarily stored in the control register 202 of the control IC 20. Moreover, switching between binary and four-valued modes is one example. The NAND flash memory may switch between binary and eight-valued modes.

As described above, it is possible to store data in binary or multiple-valued form on the basis of management information.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:

1. A semiconductor storage apparatus comprising:
    a plurality of cells that store data;
    a threshold determination section that determines, based on management information that is used to manage data, a binary or multiple-valued form by which values are written to a plurality of the individual cells and determines a threshold based on the determined form of values that are to be written to a plurality of the individual cells; and
    a write section that writes the data to a plurality of the cells on the basis of the threshold determined by the threshold determination section.

2. The semiconductor storage apparatus according to claim 1, further comprising
    a detection section that detects, as the management information, attribute information that is added to the data to indicate attributes of the data, wherein
    the threshold determination section determines, based on the attribute information of the data detected by the detection section, a binary or multiple-valued form by which values are written to a plurality of the individual cells.

3. The semiconductor storage apparatus according to claim 2, further comprising
    a threshold conversion section that reads, when a threshold of a cell in which the data is stored among a plurality of the cells is not a current threshold determined by the threshold determination section based on the attribute information of the data, data written to a plurality of the cells; and rewrites the data to a plurality of the cells on the basis of a threshold determined by the threshold determination section based on the attribute information of the written data.

4. The semiconductor storage apparatus according to claim 1, wherein
    the management information indicates the number of times data is written by the write section to a plurality of the individual cells.

5. The semiconductor storage apparatus according to claim 1, wherein
    the management information indicates the amount of free space on a plurality of the cells.

6. The semiconductor storage apparatus according to claim 1, further comprising
    a threshold correction section that determines, when a threshold of a cell in which the data is stored among a plurality of the cells is not a threshold determined by the threshold determination section, that values are written in binary form to the cells and also determines a threshold based on the binary form, wherein
    the write section rewrites data to the cells by writing the data to a plurality of the cells on the basis of the threshold determined by the threshold correction section.

7. A control apparatus for controlling a semiconductor storage apparatus that includes a plurality of cells storing data, the control apparatus comprising:
    a threshold determination section that determines, based on management information that is used to manage data, a binary or multiple-valued form by which values are written to a plurality of the individual cells and determines a threshold based on the determined form of values that are to be written to a plurality of the individual cells; and
    a write section that writes the data to a plurality of the cells on the basis of the threshold determined by the threshold determination section.

8. The control apparatus according to claim 7, further comprising
    a detection section that detects, as the management information, attribute information that is added to the data to indicate attributes of the data, wherein
    the threshold determination section determines, based on the attribute information of the data detected by the detection section, a binary or multiple-valued form by which values are written to a plurality of the individual cells.

9. The control apparatus according to claim 8, further comprising
    a threshold conversion section that reads, when a threshold of a cell in which the data is stored among a plurality of the cells is not a current threshold determined by the threshold determination section based on the attribute information of the data, data written to a plurality of the cells; and rewrites the data to a plurality of the cells on the basis of a threshold determined by the threshold determination section based on the attribute information of the written data.

10. The control apparatus according to claim 7, wherein
    the management information indicates the number of times data is written by the write section to a plurality of the individual cells.

11. The control apparatus according to claim 7, wherein
    the management information indicates the amount of free space on a plurality of the cells.

12. The control apparatus according to claim 7, further comprising
    a threshold correction section that determines, when a threshold of a cell in which the data is stored among a plurality of the cells is not a threshold determined by the threshold determination section, that values are written in binary form to the cells and also determines a threshold based on the binary form, wherein
    the write section rewrites data to the cells by writing the data to a plurality of the cells on the basis of the threshold determined by the threshold correction section.

13. A control method for controlling a semiconductor storage apparatus that includes a plurality of cells storing data, the control method causing the semiconductor storage apparatus to execute:

determining, based on management information that is used to manage data, a binary or multiple-valued form by which values are written to a plurality of the individual cells and determining a threshold based on the determined form of values that are to be written to a plurality of the individual cells; and writing the data to a plurality of the cells on the basis of the determined threshold.

14. The control method according to claim 13, further causing the semiconductor storage apparatus to execute:

detecting, as the management information, attribute information that is added to the data to indicate attributes of the data; and determining, based on the detected attribute information of the data, a binary or multiple-valued form by which values are written to a plurality of the individual cells.

15. The control method according to claim 14, further causing the semiconductor storage apparatus to execute reading, when a threshold of a cell in which the data is stored among a plurality of the cells is not a current threshold determined based on the attribute information of the data, data written to a plurality of the cells; and rewriting the data to a plurality of the cells on the basis of a threshold determined based on the attribute information of the written data.

16. The control method according to claim 13, wherein the management information indicates the number of times data is written to a plurality of the individual cells.

17. The control method according to claim 13, wherein the management information indicates the amount of free space on a plurality of the cells.

18. The control method according to claim 13, further causing the semiconductor storage apparatus to execute:

determining, when a threshold of a cell in which the data is stored among a plurality of the cells is not a determined threshold, that values are written in binary form to the cells and also determining a threshold based on the binary form; and rewriting data to the cells by writing the data to a plurality of the cells on the basis of the determined threshold.

\* \* \* \* \*